(12) United States Patent
Stankovic et al.

(10) Patent No.: US 7,653,867 B2
(45) Date of Patent: Jan. 26, 2010

(54) MULTI-SOURCE DATA ENCODING, TRANSMISSION AND DECODING USING SLEPIAN-WOLF CODES BASED ON CHANNEL CODE PARTITIONING

(75) Inventors: Vladimir M. Stankovic, Bryan, TX (US); Angelos D. Liveris, Stafford, TX (US); Zixiang Xiong, Spring, TX (US); Costas N. Georghiades, College Station, TX (US)

(73) Assignee: The Texas A&M University System, College Station, TX (US)

(*) Notice: Subject to any disclaimer, the term of this patent is extended or adjusted under 35 U.S.C. 154(b) by 679 days.

(21) Appl. No.: 11/086,974

(22) Filed: Mar. 22, 2005

(65) Prior Publication Data

US 2006/0200724 A1      Sep. 7, 2006

Related U.S. Application Data

(63) Continuation-in-part of application No. 11/069,935, filed on Mar. 1, 2005.

(60) Provisional application No. 60/657,520, filed on Mar. 1, 2005.

(51) Int. Cl.
  *H03M 13/00* (2006.01)
(52) U.S. Cl. ...................................... 714/785
(58) Field of Classification Search ................ 714/752, 714/781, 784, 785
  See application file for complete search history.

(56) References Cited

U.S. PATENT DOCUMENTS 5,805,615 A * 9/1998 Chen ........................... 714/757
6,219,817 B1    4/2001 Holman
6,810,499 B2 * 10/2004 Sridharan et al. ............ 714/755
6,895,547 B2    5/2005 Eleftheriou et al.
7,278,085 B1 * 10/2007 Weng et al. .................. 714/766
2006/0048038 A1   3/2006 Yedidia et al.

OTHER PUBLICATIONS

David Slepian and J.K. Wolf; "Noiseless Coding of Correlated Information Sources"; IEEE Transactions on Information Theory; Jul. 1973; pp. 471-480; vol. 19, No. 4.
Toby Berger; "Multiterminal Source Coding", CISM Summer School on the Information Theory Approach to Communications; Jul. 1977; Springer-Verlag, New York.

(Continued)

*Primary Examiner*—Esaw T Abraham
(74) *Attorney, Agent, or Firm*—Knobbe, Martens, Olson & Bear LLP

(57) ABSTRACT

System and method for Slepian-Wolf coding using channel code partitioning. A generator matrix is partitioned to generate multiple sub-matrices corresponding respectively to multiple correlated data sources. The partitioning is in accordance with a rate allocation among the correlated data sources. Corresponding parity matrices may be generated respectively from the sub-matrices, where each parity matrix is useable to encode correlated data for a respective correlated data source, resulting in respective syndromes, e.g., in the form of binary vectors. A common receiver may receive the syndromes and expand them to a common length by inserting zeros appropriately. The expanded syndromes may be vector summed (e.g., modulo 2), and a single channel decoding applied to determine a closest codeword, portions of whose systematic part may be multiplied by respective submatrices of the generator matrix, which products may be added to the respective expanded syndromes to produce estimates of the source data.

11 Claims, 17 Drawing Sheets

OTHER PUBLICATIONS

Jack Keil Wolf; "Data reduction for multiple correlated sources"; Proceeding of the 5th Colloquium on Microwave Communication; Jun. 1973; pp. 287-295; Budapest, Hungary.

Tomas M. Cover; "A proof of the data compression theorem of Slepian and Wolf for ergodic sources"; IEEE Transactions on Information Theory; Mar. 1975; pp. 226-228; vol. 21, Issue 2.

Aaron D. Wyner; "Recent Results in the Shannon Theory"; IEEE Transactions on Information Theory; Jan. 1974; pp. 2-10; vol. 20, No. 1.

Aaron D. Wyner; "On Source Coding with Side Information at the Decoder," IEEE Transactions on Information Theory; May 1975; pp. 294-300; vol. 21, No. 3.

Janos Korner and Katalin Marton; "Images of a Set via Two Channels and their Role in Multi-User Communication"; IEEE Transactions on Information Theory; Nov. 1977; pp. 751-761; vol. iT-23.

Rudolf F. Ahlswede and Janos Korner; "Source Coding with Side Information and a Converse for Degraded Broadcast Channels"; IEEE Transactions on Information Theory; Nov. 1975; pp. 629-637; vol. 21, No. 6.

Andrea Sgarro; "Source Coding with Cide Information at Several Decoders," IEEE Transactions on Information Theory; Mar. 1977; pp. 179-182; vol. 23, No. 2.

R. M. Gray and A. D. Wyner; "Source Coding for a Simple Network," The Bell System Technical Journal; Nov. 1974; pp. 1681-1721; vol. 53.

S. I. Gel'fand and M. S. Pinsker; "Coding of Sources on the Basis of Observations with Incomplete Information"; Translated from Problemy Peredachi Informatisii; Apr.-Jun. 1979; pp. 115-125; vol. 15, No. 2.

Te Sun Han and Kingo Kobayashi; "A unified achievable rate region for a general class of multiterminal source coding systems"; IEEE Transactions on Information Theory; May 1980; pp. 277-288; vol. 26, No. 3.

Imre Csiszar and Janos Korner; "Towards a General Theory of Source Networks"; IEEE Transactions on Information Theory; Mar. 1980; pp. 155-165; vol. 26, No. 2.

Sandeep Pradhan and Kannan Ramchandran; "Distributed Source Coding Using Syndromes (DISCUS): Design and Construction"; IEEE Transactions on Information Theory; Mar. 2003; pp. 626-643; vol. 49, No. 3.

Angelos D. Liveris, Zixiang Xiong and Costas N. Georghiades; "Distributed Compression of Binary Sources Using Conventional Parallel and Serial Concatenated Convolutional Codes"; Proceedings of Data Compression Conference; Mar. 2003; pp. 193-202; Snowbird, UT.

Anne Aaron and Bernd Girod; "Compression of Side Information Using Turbo Codes"; Proceeding of Data Compression Conference; Apr. 2002; pp. 252-261; Snowbird, UT.

Javier Garcia-Frias and Ying Zhao; "Compression of Correlated Binary Sources Using Turbo Codes"; IEEE Communications Letters; Oct. 2001; pp. 417-419; vol. 5., No. 10.

Jan Bajcy and Patrick Mitran; "Coding for the Slepian-Wolf Problem With Turbo Codes"; Global Telecommunications Conference; Nov. 2001; pp. 1400-1404; vol. 2; San Antonio, TX.

A. Liveris, Z. Xiong, and C. Georghiades; "Compression of binary sources with side information at the decoder using LDPC codes"; IEEE Communications Letters, Oct. 2002; pp. 440-442; vol. 6.

Jing Li, Zhenyu Tu and Rick S. Blum; "Slepian-Wolf Coding for Nonuniform Sources Using Turbo Codes"; Proceedings of the Data Compression Conference; Mar. 2004; pp. 312-321; Snowbird, UT.

Jim Chou, S. Sandeep Pradhan and Kannan Ramchandran; "Turbo and Trellis-Based Constructions for Source Coding with Side Information"; Proceedings of the Conference on Data Compression; Mar. 2003; pp. 33-42; Snowbird, UT.

B. Rimoldi and R. Urbanke; "Asynchronous Slepian-Wolf Coding Via Source-Splitting", IEEE International Symposium on Information Theory; Jun. 1997; p. 271; Ulm, Germany.

Todd P. Coleman, Anna H. Lee, Muriel Medard, and Michelle Effros; "On Some New Approaches to Practical Slepian-Wolf Compression Inspired by Channel Coding"; Proceedings of Data Compression Conference; Mar. 2004; pp. 282-291; Snowbird, UT.

J. M. Kahn, R. H. Katz and K. S. J. Pister; "Next Century Challenges: Mobile Networking for 'Smart dust'"; International Conference on Mobile Computing and Networking; Aug. 1999; pp. 271-278; Seattle, WA.

Angelos D. Liveris, Ching-Fun Lan, Krishna R. Narayanan, Zixiang Xiong and Costas N. Georghiades; "Slepian-Wolf Coding of Three Binary Sources Using LDPC Codes"; Proceedings of International Symposium on Turbo Codes and Related Topics; Sep. 2003; Brest, France.

Ching-Fu Lan, Angelos D. Liveris, Krishna Narayanan, Zixiang Xiong and Costas Georghiades; "Slepian-Wolf Coding of Multiple M-ary Sources Using LDPC Codes"; Proc. DCC-2004, Data Compression Conference, pp. 549, Snowbird, UT, Mar. 2004.

S. Sandeep Pradhan and Kannan Ramchandran; "Distributed source coding: Symmetric rates and applications to sensor networks"; Proceedings of Data Compression Conference; Mar. 2000; pp. 363-372; Snowbird, UT.

Ram Zamir, Shlomo Shamai and Uri Erez; "Nested Linear/Lattice Codes for Structured Multiterminal Binning"; IEEE Transactions on Information Theory; Jun. 2002; pp. 1250-1276; vol. 48, No. 6.

Vladimir Stankovid, Angelos D. Liveris, Zixiang Xiong and Costas Georghiades; "Design of Slepian-Wolf Codes by Channel Code Partitioning"; Proceedings of Data Compression Conference; Mar. 2004; pp. 302-311, Snowbird, UT.

Vladimir Stankovid, Angelos D. Liveris, Zixiang Xiong and Costas Georghiades; "Code Design for Lossless Multiterminal Networks"; International Symposium on Information Theory; Jun. 2004; p. 26.

Nicolas Gehrig and Pier Luigi Dragotti; "Symmetric and A-Symmetric Slepian-Wolf Codes with Systematic and Non-Systematic Linear Codes"; IEEE Communications Letters; Jan. 2005; pp. 61-63; vol. 9, No. 1.

Hui Jin, Aamod Khandekar and Robert McEliece; "Irregular Repeat-Accumulate Codes"; Proceedings of International Symposium on Turbo Codes and Related Topics; Sep. 2000; pp. 1-8.

Claude Berrou, Alain Glavieux and Punya Thitimajshima; "Near Shannon limit error-correcting coding and decoding: Turbo codes (1)"; IEEE International Conference on Communications; 1993; pp. 1064-1070; Geneva, Switzerland.

D. Schonberg, K. Ramchandran and S.S. Pradhan; "Distributed code constructions for the entire Slepian-Wolf rate region for arbitrarily correlated sources"; Proceedings of Data Compression Conference; Mar. 2004; pp. 292-301, Snowbird, UT.

G. David Forney, Jr.; "Coset Codes—Part I: Introduction and Geometrical Classification"; IEEE Transactions on Information Theory; Sep. 1988; pp. 1123-1151; vol. 34, No. 5.

G. David Forney, Jr.; "Coset Codes—Part II: Binary Lattices and Related Codes," IEEE Transactions on Information Theory; Sep. 1988; pp. 1152-1187; vol. 34, No. 5.

G. David Forney, Jr.; "Geometrically Uniform Codes," IEEE Transactions on Information Theory; Sep. 1991; pp. 1241-1260; vol. 37, No. 5.

Giuseppe Caire, Shlomo Shamai and Sergio Verdu; "Lossless Data Compression with Error Correcting Codes," IEEE International Symposium on Information Theory; Jun.-Jul. 2003; p. 22.

Prashant Koulgi, Ertem Tuncel, Shankar L. Regunathan and Kenneth Rose; "On Zero-Error Coding of Correlated Sources," IEEE Transactions on Information Theory; Nov. 2003; pp. 2856-2873; vol. 49, No. 11.

Toby Berger, Zhen Zhang and Harish Viswanathan; "The CEO Problem," IEEE Transactions on Information Theory; May 1996; pp. 887-902; vol. 42, No. 3.

Aaron D. Wyner and Jacob Ziv; "The Rate-Distortion Function for Source Coding with Side Information at the Decoder", IEEE Transactions on Information Theory; Jan. 1976; pp. 1-10; vol. 22, No. 1.

Yasutada Oohama; "The Rate-Distortion Function for the Quadratic Gaussian CEO Problem"; IEEE Transactions on Information Theory; May 1998; pp. 1057-1070; vol. 44, No. 3.

Yang Yang, Samuel Cheng, Zixiang Xiong, and Wei Zhao; "Wyner-Ziv coding based on TCQ and LDPC codes"; 37th Asilomar Conference on Signals, Systems, and Computers; Nov. 2003; pp. 825-829; Pacific Grove, CA.

* cited by examiner

MULTI-SOURCE DATA ENCODING, TRANSMISSION AND DECODING USING SLEPIAN-WOLF CODES BASED ON CHANNEL CODE PARTITIONING

PRIORITY AND CONTINUATION DATA

This application is a continuation-in-part of U.S. patent application Ser. No. 11/069,935, titled "Multi-Source Data Encoding, Transmission and Decoding Using Slepian-Wolf Codes Based On Channel Code Partitioning", filed Mar. 1, 2005, whose inventors are Vladimir M. Stankovic, Angelos D. Liveris, Zixiang Xiong, and Costas N. Georghiades, including Appendices A through H, and claims benefit of priority to U.S. Provisional Application Ser. No. 60/657,520, titled "Multi-Source Data Encoding, Transmission and Decoding", filed Mar. 1, 2005, whose inventors are Vladimir M. Stankovic, Angelos D. Liveris, Zixiang Xiong, Costas N. Georghiades, Zhixin Liu, Samuel S. Cheng, and Qian Xu.

STATEMENT OF U.S. GOVERNMENT LICENSING RIGHTS

The U.S. Government has a paid-up license in this invention and the right in limited circumstances to require the patent owner to license others on reasonable terms as provided for by the terms of grant number CCR-01-04834 awarded by the National Science Foundation (NSF).

FIELD OF THE INVENTION

The present invention relates to the field of information coding, and more particularly to a system and method for designing Slepian-Wolf codes for multi-source encoding/decoding.

DESCRIPTION OF THE RELATED ART

Issues related to distributed lossless compression of correlated source data are relevant for a wide variety of applications, such as distributed sensor networks and multi-source video distribution, both wired and wireless, coding for relay channels, digital communications, and clients sending important files to a central database, among others, i.e., whenever data or measurements must be transmitted and precisely reconstructed.

To achieve efficient transmission, well-known entropy coding techniques can be employed at each transmitter to reduce the required rate to the entropy limit. However, if clients/sensors send similar, and thus, correlated data, then, although they do not communicate among each other, exploiting the correlation can lead to further reduction in total rate cost. Indeed, Slepian and Wolf [1] showed that lossless compression of two separate sources (i.e., data from two sources) can be as efficient as if they are compressed together, as long as joint decoding is done at the receiver (see FIG. 1A, described below). This remarkable result was an immediate impetus for intense research that resulted in the development of multiterminal (MT) source coding theory [2]. Indeed, soon after the appearance of the Slepian-Wolf theorem, the extension to multiple sources [3] and ergodic processes [4] was provided. Solutions for simple communication networks with two or three transmitters and receivers appeared in [5], [6], [7], [8], [9], [10]. The remote problem, where transmitters are provided only with (corrupted) replicas of original sources was studied in [11]. The achievable rate region for the entire lossless MT network with arbitrary number of encoders and decoders was given in [12], [13].

Note that as used herein, the term "source" may be used to refer to source data provided by a source, as well as a device that collects the original data, encodes the data, and/or transmits the encoded data to a receiver, e.g., for decoding.

Due to great practical potentials, designing codes for lossless MT networks has assumed increased interest recently. Some successful attempts at constructing practical coding schemes for the Slepian-Wolf (SW) problem appeared in [14], [15], [16], [17], [18], [19], [20]. All these schemes, with the exception [17], are based on asymmetric codes [see Appendix G of U.S. patent application Ser. No. 11/069,935, titled "Multi-Source Data Encoding, Transmission and Decoding Using Slepian-Wolf Codes Based On Channel Code Partitioning", filed Mar. 1, 2005, incorporated by reference below, where Appendix G comprises the paper "Generalized Coset Codes for Symmetric Distributed Source Coding" by S. Sandeep Pradhan and Kannan Ramchandran, referred to henceforth as "Appendix G"]; that is, they compress losslessly one source, while the other source is assumed to be perfectly known at the decoder and is used as side information.

Thus, for two discrete, memoryless, identically distributed sources X and Y encoded separately at rates $R_1$ and $R_2$, respectively, these codes attempt to reach the two corner points on the Slepian-Wolf (SW) bound: $(R_1,R_2)=(H(X),H(Y|X))$ and $(R_1,R_2)=(H(Y),H(X|Y))$, as illustrated in prior art FIGS. 1A and 1B.

As FIG. 1A shows, correlated data X and Y are encoded independently by respective encoders 1 and 2, and the encoded data transmitted to a joint decoder which decodes the data, producing estimates of the data $\hat{X}$ and $\hat{Y}$.

FIG. 1B illustrates the theoretical bound for Slepian-Wolf encoding, and the admissible, e.g., achievable, region for rate allocation between multiple sources. Note that the diagonal dashed line specifying the bound for joint decoding indicates a linear relationship between the rates for joint encoding and decoding. Note also the corner points A and B, indicating compression of X with side information Y at the joint decoder, and compression of Y with side information X at the joint decoder, respectively.

Often, it is desirable to vary the rates of individual encoders (e.g., to approach the middle point C in FIG. 1B) while keeping the total sum-rate constant. The first method of achieving this is time sharing. However, time sharing might not be practical in some cases. The second method is the source-splitting approach [22], [23], which potentially reaches all points on the SW bound by splitting two sources into three subsources of lower entropy. Garcia-Frias and Zhao [17] propose a system consisting of two different turbo codes which form a big turbo code with four component codes. In the symmetric scenario (the rates of both encoders are the same) suggested, half of the systematic bits from one encoder and half from the other are sent. Further, instead of syndrome bits [14], parity bits are sent.

For many applications, such as sensor networks [24], it is important to consider multiple arbitrarily correlated and distributed sources, e.g., source data that is arbitrarily correlated and that has an arbitrary statistical distribution. Compression of three and four sources was treated in [25] and [26], respectively, but only uniformly distributed sources, a specific correlation model, and asymmetric coding (approaching SW corner points) were considered.

Recently, Pradhan and Ramchandran [27], [Appendix G] outlined a theoretical method for constructing a single code for compressing two memoryless, binary, uniformly distributed sources based on the syndrome technique [14], which achieves arbitrary rate allocation among the two encoders. The method constructs independent subcodes of the main code and assigns them to different encoders. Each encoder sends only partial information about the corresponding source data; by combining two received bitstreams, a joint decoder should perfectly reconstruct the source data from the data sources. Since joint decoding is done only on a single code, if this code approaches the capacity of a channel that models the correlation among the sources (i.e., among the different source data), the system will approach the SW limit. Thus, the great advantage of this theoretical setup is the need of only one good channel code. It is also shown in [Appendix G] that this code does not suffer from any performance loss compared to the corresponding asymmetric code. Moreover, any point on the SW bound can potentially be reached without increasing the encoding/decoding complexity.

While the theoretical limits and bounds of SW coding are well understood, practical implementations and their actual performance and limits have not heretofore been determined.

SUMMARY OF THE INVENTION

One embodiment of the present invention comprises a system and method for implementing Slepian-Wolf codes by channel code partitioning.

In one embodiment, a generator matrix is partitioned to generate a plurality of sub-matrices corresponding respectively to a plurality of correlated data sources (e.g., corresponding respectively to correlated data from multiple sources). The partitioning may be performed in accordance with a rate allocation among the plurality of correlated data sources. A corresponding plurality of parity matrices may then be generated based respectively on the sub-matrices of the generator matrix, where each parity matrix is useable to encode correlated data for or from a respective correlated data source, resulting in respective syndromes, e.g., in the form of binary vectors. A common receiver may receive the syndromes and expand them to a common length by inserting zeros appropriately. The expanded syndromes may be vector summed (e.g., modulo 2), and a single channel decoding applied to determine a closest codeword, portions of whose systematic part may be multiplied by respective submatrices of the generator matrix, which products may be added to the respective expanded syndromes to produce estimates of the source data.

BRIEF DESCRIPTION OF THE DRAWINGS

A better understanding of the present invention can be obtained when the following detailed description of the preferred embodiment is considered in conjunction with the following drawings, in which.

Figure 1A:
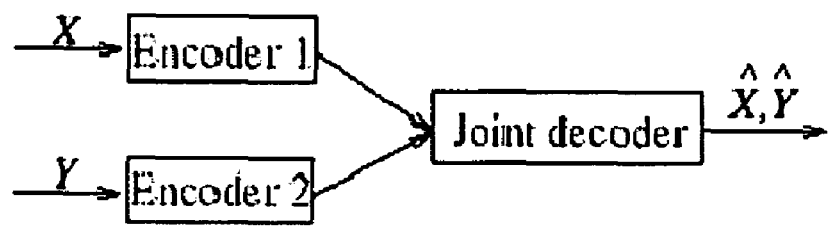
FIG. 1A is a block diagram of a system with multiple encoders and a joint decoder, according to the prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following references are hereby incorporated by reference in their entirety as though fully and completely set forth herein:

U.S. Provisional Application Ser. No. 60/657,520, titled "Multi-Source Data Encoding, Transmission and Decoding", filed Mar. 1, 2005, whose inventors are Vladimir M. Stankovic, Angelos D. Liveris, Zixiang Xiong, Costas N. Georghiades, Zhixin Liu, Samuel S. Cheng, and Qian Xu;

U.S. patent application Ser. No. 11/069,935, titled "Multi-Source Data Encoding, Transmission and Decoding Using Slepian-Wolf Codes Based On Channel Code Partitioning", filed Mar. 1, 2005, whose inventors are Vladimir M. Stankovic, Angelos D. Liveris, Zixiang Xiong, and Costas N. Georghiades, including Appendices A through H.

U.S. patent application Ser. No. 11/068,737, titled "Data Encoding and Decoding Using Slepian-Wolf Coded Nested Quantization to Achieve Wyner-Ziv Coding", filed Mar. 1, 2005, whose inventors are Zhixin Liu, Samuel S. Cheng, Angelos D. Liveris, and Zixiang Xiong, including Appendices A through H.

The following publications are incorporated by reference in their entirety as though fully and completely set forth herein, and are referenced herein by the reference numbers (in the form [x]) as listed:

[1] D. Slepian and J. K. Wolf, "Noiseless coding of correlated information sources," IEEE Trans. Inform. Theory, vol. IT-19, pp. 471-480, July 1973.

[2] T. Berger, "Multiterminal source coding," The Information Theory Approach to Communications, G. Longo, Ed., New York: Springer-Verlag, 1977.

[3] J. K. Wolf, "Data reduction for multiple correlated sources," Proc. 5th Colloquium Microwave Communication, pp. 287-295, June 1973.

[4] T. Cover, "A proof of the data compression theorem of Slepian and Wolf for ergodic sources," IEEE Trans. Inform. Theory, vol. IT-21, pp. 226-228, March 1975.

[5] A. Wyner, "Recent results in the Shannon theory," IEEE Trans. Inform. Theory, vol. 20, pp. 2-10, January 1974.

[6] A. D. Wyner, "On source coding with side information at the decoder," IEEE Trans. Inform. Theory, vol. IT-21, pp. 294-300, May 1975.

[7] J. Körner and K. Marton, "Images of a set via two channels and their role in multi-user communication," IEEE Trans. Inform. Theory, vol. IT-23, pp. 751-761, November 1977.

[8] R. F. Ahlswede and J. Körner, "Source coding with side information and a converse for degraded broadcast channels," IEEE Trans. Inform. Theory, vol. IT-21, pp. 629-637, November 1975.

[9] A. Sgarro, "Source coding with side information at several decoders," IEEE Trans. Inform. Theory, vol. IT-23, pp. 179-182, March 1977.

[10] R. M. Gray and A. D. Wyner, "Source coding for a simple network," Bell Syst. Tech. J., vol. 53, pp. 1681-1721, November 1974.

[11] S. I. Gel'fand and M. S. Pinsker, "Coding of sources on the basis of observations with incomplete information," Probl. Peredach. Inform., vol. 15, pp. 45-57, April-June 1979.

[12] T. S. Han and K. Kobayashi, "A unified achievable rate region for a general class of multiterminal source coding systems," IEEE Trans. Inform. Theory, vol. IT-26, pp. 277-288, May 1980.

[13] I. Csiszár and J. Körner, "Towards a general theory of source networks," IEEE Trans. Inform. Theory, vol. IT-26, pp. 155-165, Mar. 1980.

[14] S. S. Pradhan and K. Ramchandran, "Distributed source coding using syndromes (DISCUS): design and construction," Proc. DCC-1999, Data Compression Conference, pp. 158-167, Snowbird, Utah, March 1999.

[15] A. Liveris, Z. xiong, and C. Georghiades, "Distributed compression of binary sources using convolutional parallel and serial concatenated convolutional codes," Proc. DCC-2003, Data Compression Conference, pp. 193-202, Snowbird, Utah, March 2003.

[16] A. Aaron and B. Girod, "Compression of side information using turbo codes," Proc. DCC-2002, Data Compression Conference, pp. 252-261, Snowbird, Utah, April 2002.

[17] J. Garcia-Frias and Y. Zhao, "Compression of correlated binary sources using turbo codes," IEEE Communications Letters, vol. 5, pp. 417-419, October 2001.

[18] J. Bajcy and P. Mitran, "Coding for the Slepian-Wolf problem with turbo codes," Proc. IEEE Globecom-2001, vol. 2 pp. 1400-1404, San Antonio, Tex., November 2001.

[19] A. Liveris, Z. Xiong, and C. Georghiades, "Compression of binary sources with side information at the decoder using LDPC codes," IEEE Communications Letters, vol. 6, pp. 440-442, October 2002.

[20] J. Li, Z. Tu, and R. S. Blum, "Slepian-Wolf Coding for Nonuniform Sources Using Turbo Codes," Proc. DCC-2004, Data Compression Conference, pp. 312-321, Snowbird, Utah, March 2004.

[21] J. Chou, S. S. Pradhan and K. Ramchandran, "Turbo and trellis-based constructions for source coding with side information," Proc. DCC-2003, Data Compression Conference, pp. 33-42, Snowbird, Utah, March 2003.

[22] B. Rimoldi and R. Urbanke, "Asynchronous Slepian-Wolf coding via source-splitting," Proc. ISIT-1997 IEEE Int. Symp. Inform. Theory, pp. 271, Ulm, Germany, June 1997.

[23] T. P. Coleman, A. H. Lee, M. Medard, and M. Effros, "On Some New Approaches to Practical Slepian-Wolf Compression Inspired by Channel Coding," Proc. DCC-2004, Data Compression Conference, pp. 282-291, Snowbird, Utah, March 2004.

[24] J. Kahn, R. Katz, and K Pister, "Next century challenges: Mobile networking for smart dust," Proc. of fifth annual ACM/IEEE International Conference on Mobile Computing and Networking, pp. 271-278, Seattle, Wash., August 1999.

[25] A. Liveris, C. Lan, K. Narayanan, Z. xiong, and C. Georghiades, "Slepian-Wolf coding of three binary sources using LDPC codes," Proc. Inter. Symp. Turbo Codes and Related Topics, Brest, France, September 2003.

[26] C. Lan, A. Liveris, K. Narayanan, Z. Xiong, and C. Georghiades, "Slepian-Wolf coding of multiple sources," Proc. DCC-2004, Data Compression Conference, pp. 549, Snowbird, Utah, March 2004.

[27] S. S. Pradhan and K. Ramchandran, "Distributed source coding: symmetric rates and applications to sensor networks," Proc. DCC-2000, Data Compression Conference, pp. 363-372, Snowbird, Utah, March 2000.

[28] T. Cover and J. Thomas, Elements of Information Theory, New York: Wiley, 1991.

[29] R. Zamir, S. Shamai, and U. Erez, "Nested linear/lattice codes for structured multiterminal binning," IEEE Trans. Inform. Theory, vol. 48, pp. 1250-1276, June 2002.

[30] V. Stanković, A. Liveris, Z. Xiong, and C. Georghiades, "Design of Slepian-Wolf codes by channel code partitioning," Proc. DCC-2004, Data Compression Conference, pp. 302-311, Snowbird, Utah, presented March 24, 2004, made available to conference participants Mar. 22, 2004.

[31] V. Stanković, A. Liveris, Z. Xiong, and C. Georghiades, "Code design for lossless multiterminal networks," Proc. ISIT-04, IEEE Int. Symp. Inform. Theory, Chicago, Ill., June 2004.

[32] N. Gehrig and P. L. Dragotti, "Symmetric and Asymmetric Slepian-Wolf codes with systematic and non-systematic linear codes," IEEE Communications Letters, January 2005.

[33] H. Jin, A. Khandekar, and R McEliece, "Irregular repeat-accumulate codes," Proc. of 2nd Int. Symp. Turbo codes and related topics, pp. 1-8, September 2000.

[34] C. Berrou, A. Glavieux, and P. Thitimajshima, "Near Shannon limit error-correcting coding and decoding: Turbo codes," Proc. ICC'93, IEEE Int. Conf. Comm., pp. 1064-1070, Geneva, 1993.

[35] D. Schonberg, S. S. Pradhan, and K. Ramchandran, "Distributed code constructions for the entire Slepian-Wolf rate region for arbitrarily correlated sources," Proc. DCC-2004, Data Compression Conference, pp. 292-301, Snowbird, Utah, March 2004.

[36] G. D. Forney Jr., "Coset codes-I: Introduction and geometrical classification," IEEE Trans. Inform. Theory, vol. 34, pp. 1123-1151, September 1988.

[37] G. D. Forney Jr., "Coset codes-II: Binary lattices and related codes," IEEE Trans. Inform. Theory, vol. 34, pp. 1152-1187, September 1988.

[38] G. D. Forney Jr., "Geometrically uniform codes," IEEE Trans. Inform. Theory, vol. 37, pp. 1241-1260, September 1991.

[39] G. Caire, S. Shamai, and S. Verdu, "Lossless data compression with error correcting codes," Proc. ISIT-2003, IEEE Int. Symp. Inform. Theory, Yokohama, Japan, July 2003.

[40] P. Koulgi, E. Tuncel, S. L. Regunathan, and K. Rose, "On zero-error coding of correlated sources," IEEE Trans. Inform. Theory, vol. 49, pp. 2856-2873, November 2003.

[41] T. Berger, Z. Zhang, and H. Viswanathan, "The CEO problem," IEEE Trans. Inform. Theory, vol. 42, pp. 887-902, May 1996.

[42] A. D. Wyner and J. Ziv, "The rate-distortion function for source coding with side information at the decoder," IEEE Trans. Inform. Theory, vol. IT-22, pp. 1-10, January 1976.

Terms

The following is a glossary of terms used in the present application:

Correlated Data Source—A device (preferably one of a plurality) that operates to provide correlated data in encoded form to a common receiver for decoding. The device includes an encoder, and may also include one or more of: a sensor, processor/memory, and transmitter. The term "correlated data source" or "source" may also refer to the data itself, i.e., source data, as in, "the source may be encoded and transmitted to a receiver, which may decode the transmitted encoded data to reconstruct the source".

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Programmable Hardware Element—includes various types of programmable hardware, reconfigurable hardware, programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic".

Medium—includes one or more of a memory medium, carrier medium, and/or programmable hardware element; encompasses various types of mediums that can either store program instructions/data structures or can be configured with a hardware configuration program. For example, a medium that is "configured to perform a function or implement a software object" may be 1) a memory medium or carrier medium that stores program instructions, such that the program instructions are executable by a processor to perform the function or implement the software object; 2) a medium carrying signals that are involved with performing the function or implementing the software object; and/or 3) a programmable hardware element configured with a hardware configuration program to perform the function or implement the software object.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Figure 2A:
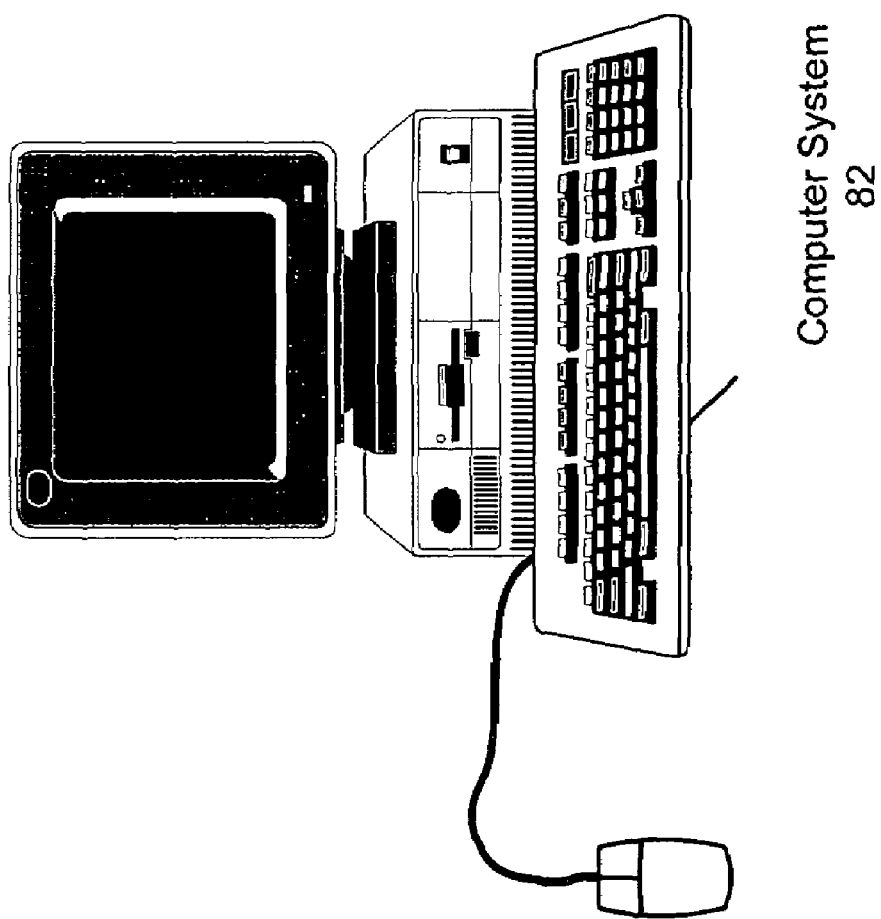
FIG. 2A illustrates a computer system suitable for implementing various embodiments of the present invention.

FIG. 2A—Computer System

FIG. 2A illustrates a computer system 82 operable to execute a program configured to implement various embodiments of the present invention. As shown in FIG. 2A, the computer system 82 may include input devices such as a mouse and keyboard, output devices (such as a display device and speakers). The computer system 82 may also include a network interface (e.g., an Ethernet card) for communicating with other computers over a network.

The computer system 82 may include a memory medium(s) on which one or more computer programs or software components according to any of various embodiments of the present invention may be stored. For example, the memory medium may store one or more programs which are executable to perform any or all of the methods described herein. The memory medium may also store operating system software, as well as other software for operation of the computer system. Various embodiments further include receiving or storing instructions and/or data implemented in accordance with the foregoing description upon a carrier medium.

Figure 2B:
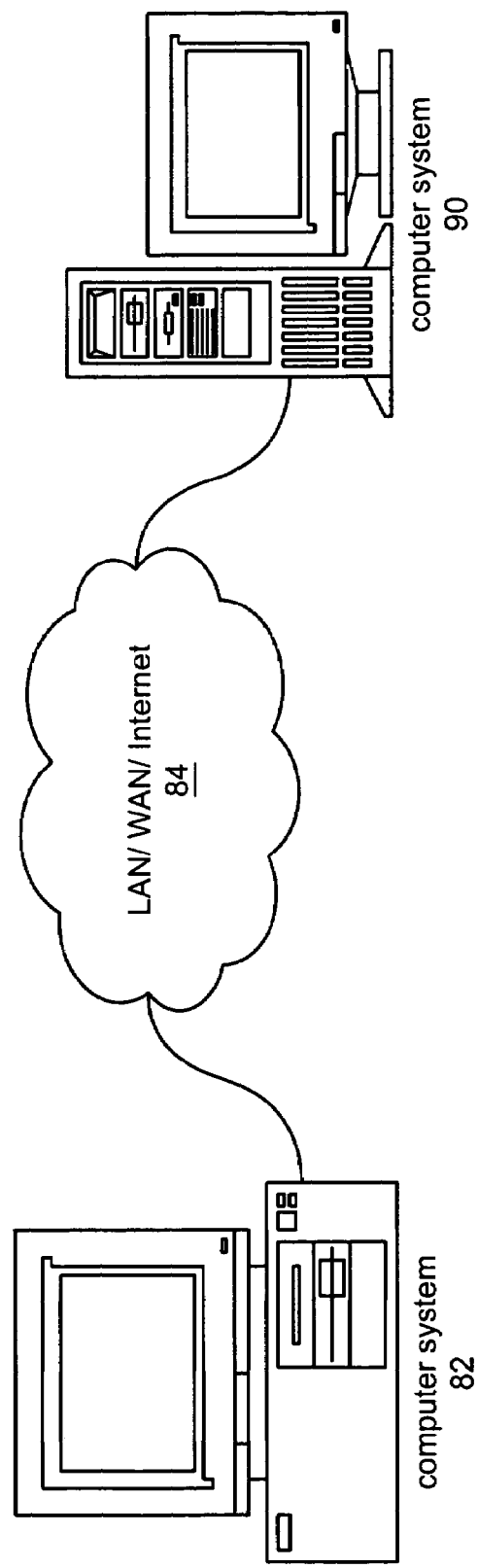
FIG. 2B illustrates a network system comprising two or more computer systems that may implement an embodiment of the present invention.

FIG. 2B—Computer Network

FIG. 2B illustrates a system including a first computer system 82 that is coupled to a second computer system 90. The computer system 82 may be connected through a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a program in a distributed fashion. For example, computer 82 may execute a first portion of the program and computer system 90 may execute a second portion of the program.

As another example, computer 82 may display the graphical user interface of a program and computer system 90 may execute a portion of the program implementing the main functionality (i.e., the non-user interface portion) of the program.

In one embodiment, the graphical user interface of the program may be displayed on a display device of the computer system 82, and the remaining portion of the program may execute on a device 190 connected to the computer system 82. The device 190 may include a programmable hardware element and/or may include a processor and memory medium which may execute a real time operating system. In one embodiment, the program may be downloaded and executed on the device 190. For example, an application development environment with which the program is associated may provide support for downloading a program for execution on the device in a real time system.

Figure 2C:
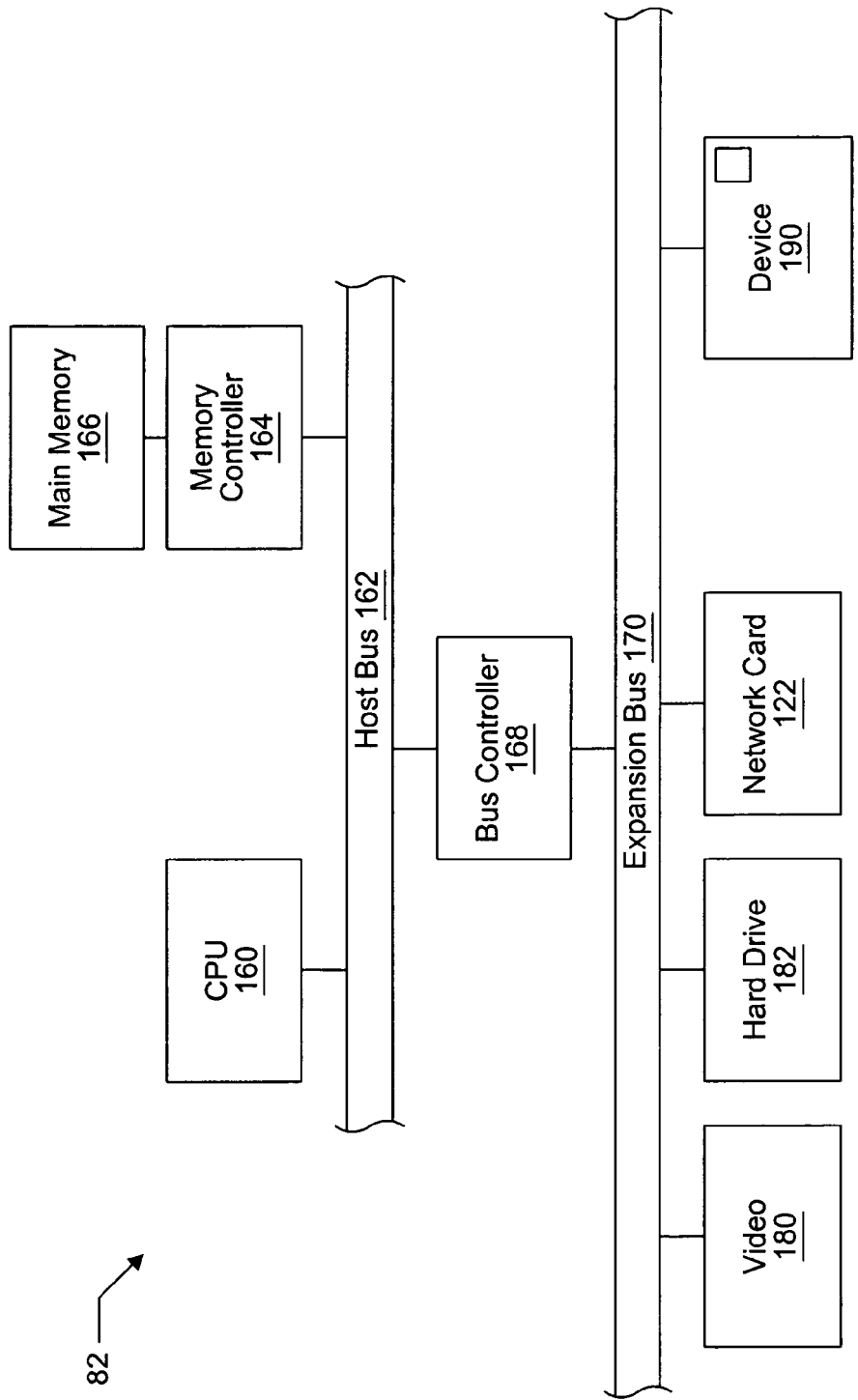
FIG. 2C is an exemplary block diagram of the computer systems of FIGS. 2A and 2B.

FIG. 2C—Computer System Block Diagram

Figure 1B:
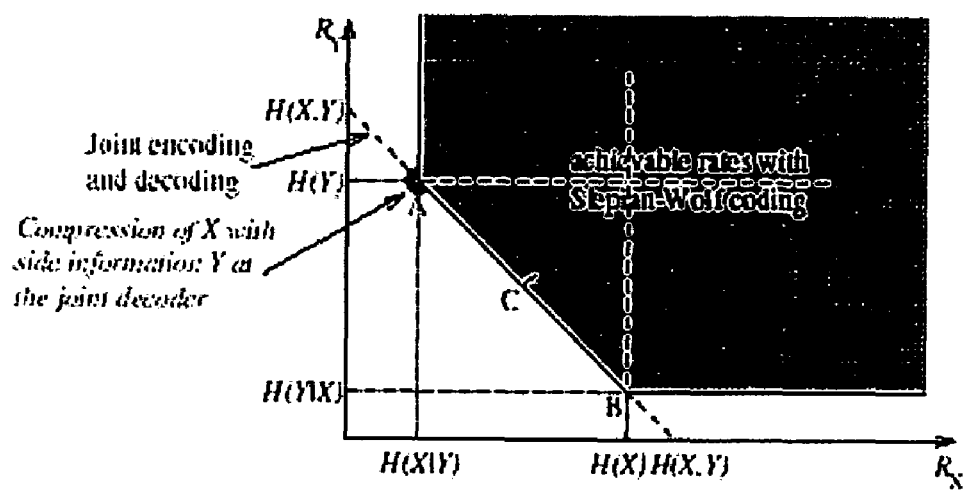
FIG. 1B illustrates the Slepian-Wolf theoretical bound and admissible region, according to the prior art.

FIG. 2C is a block diagram representing one embodiment of the computer system 82 and/or 90 illustrated in FIGS. 1A and 1B. It is noted that any type of computer system configuration or architecture can be used as desired, and FIG. 2C illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store programs operable to implement Slepian-Wolf coding according to various embodiments of the present invention. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. As shown, the computer comprises a network card 122 for communication with other devices, e.g., distributed sensor or video distribution systems, other computer systems, etc. The computer 82 further comprises a video display subsystem 180 and hard drive 182 coupled to the expansion bus 170.

As shown, a device 190 may also be connected to the computer. The device 190 may include a processor and memory which may execute a real time operating system. The device 190 may also or instead comprise a programmable hardware element. The computer system may be operable to deploy programs according to various embodiments of the present invention to the device 190 for execution of the program on the device 190.

Figure 3A:
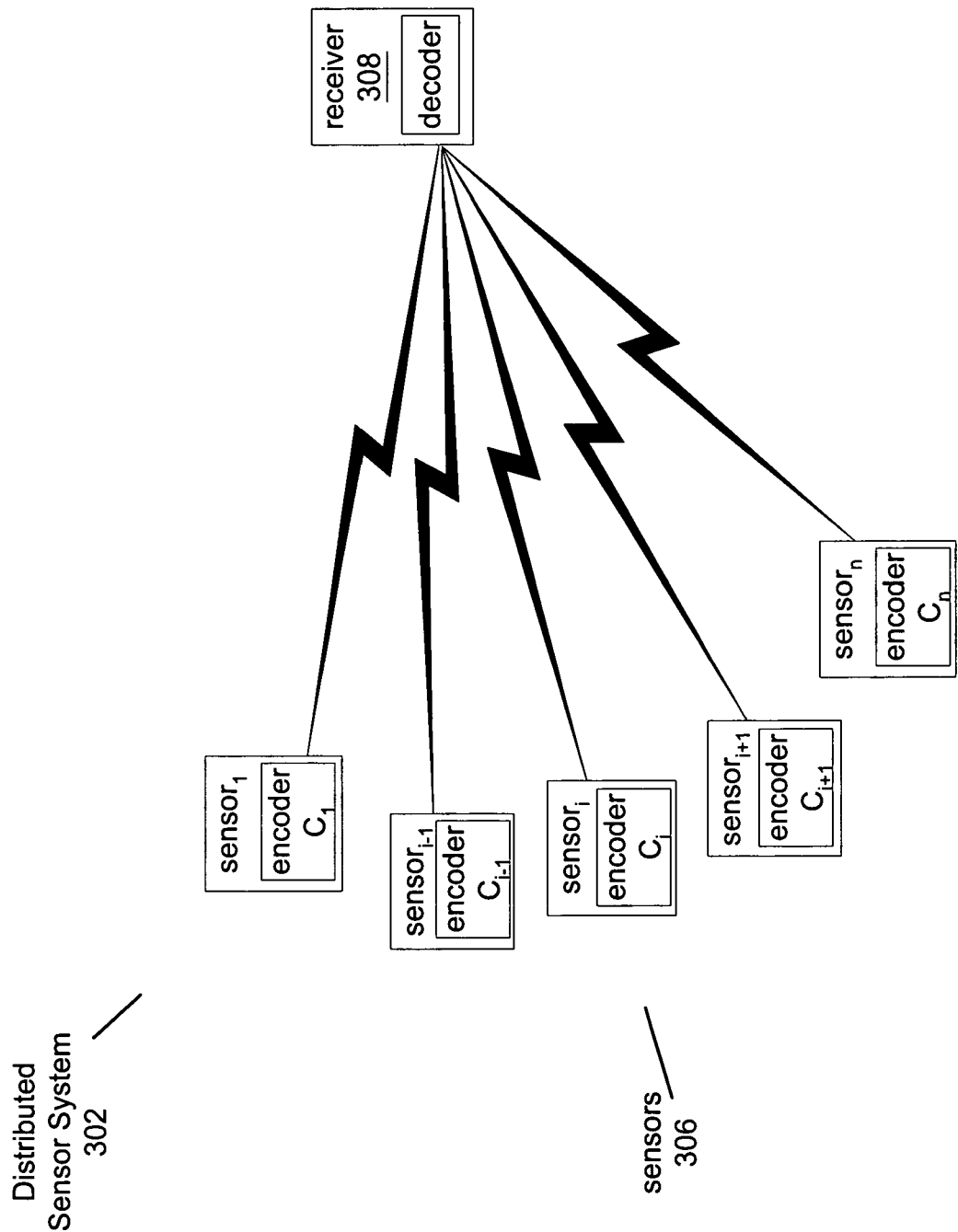
FIGS. 3A and 3B illustrate exemplary applications of the present invention, according to various embodiments.
Figure 3B:
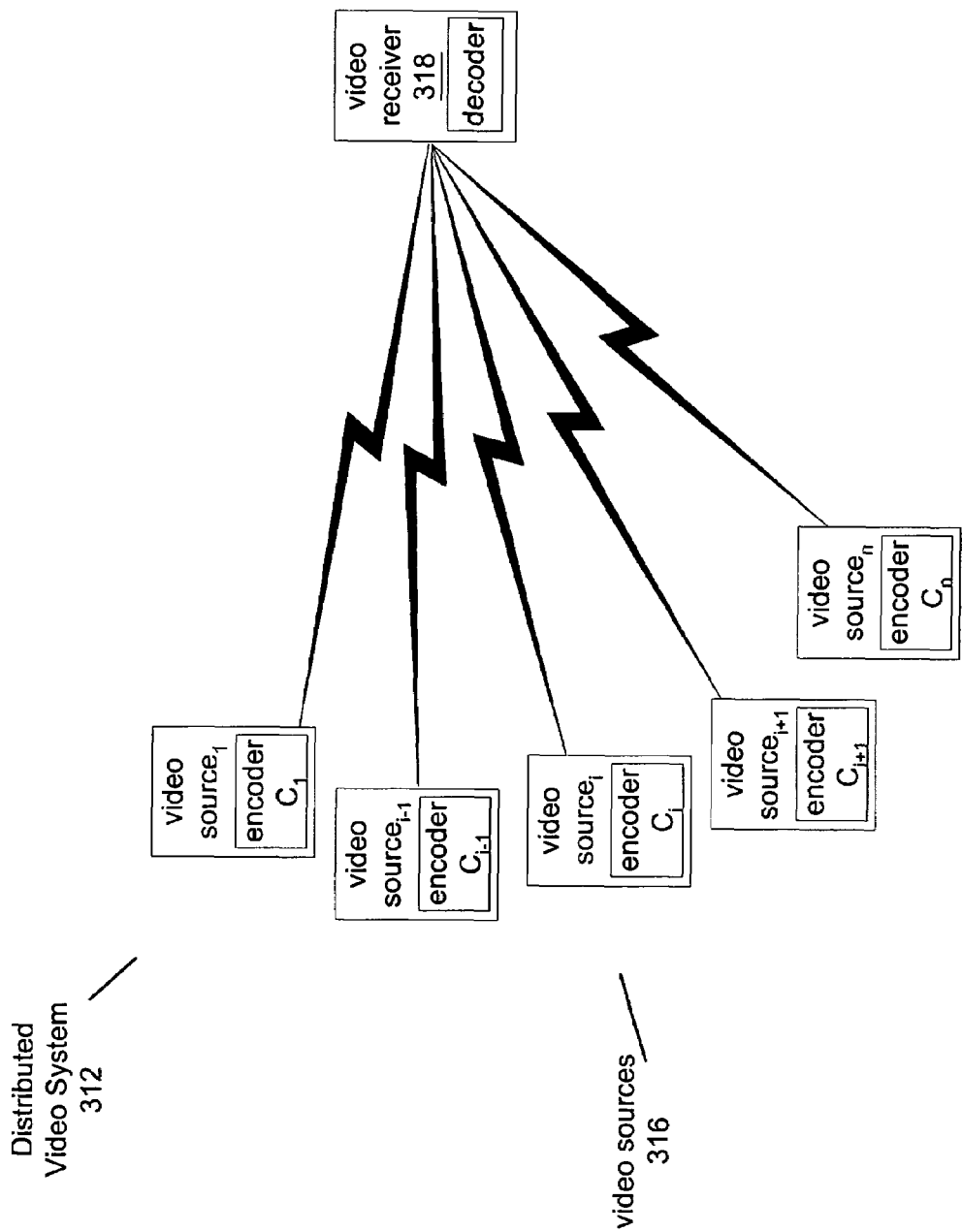

FIGS. 3A and 3B—Exemplary Systems

Various embodiments of the present invention may be directed to distributed sensor systems, wireless or wired distributed video systems, or any other type of information processing or distribution systems utilizing information coding, e.g., Slepian-Wolf coding.

For example, FIG. 3A illustrates one embodiment of a distributed sensor system. As FIG. 3A shows, a receiver 308 may be operable to receive signals, e.g., correlated signals, from a plurality of data sources, specifically from a plurality of sensors 306. However, it is noted that the present invention can be used for a plethora of applications and is not limited to the above applications. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc., as well as network control, network monitoring, financial applications, entertainment, games, etc.

Various embodiments of methods for designing, implementing, and using Slepian-Wolf coding with channel partitioning for multiple data sources are described below. Additional details, including theoretical foundations and experimental results, follow the descriptions of these methods.

Figure 4:
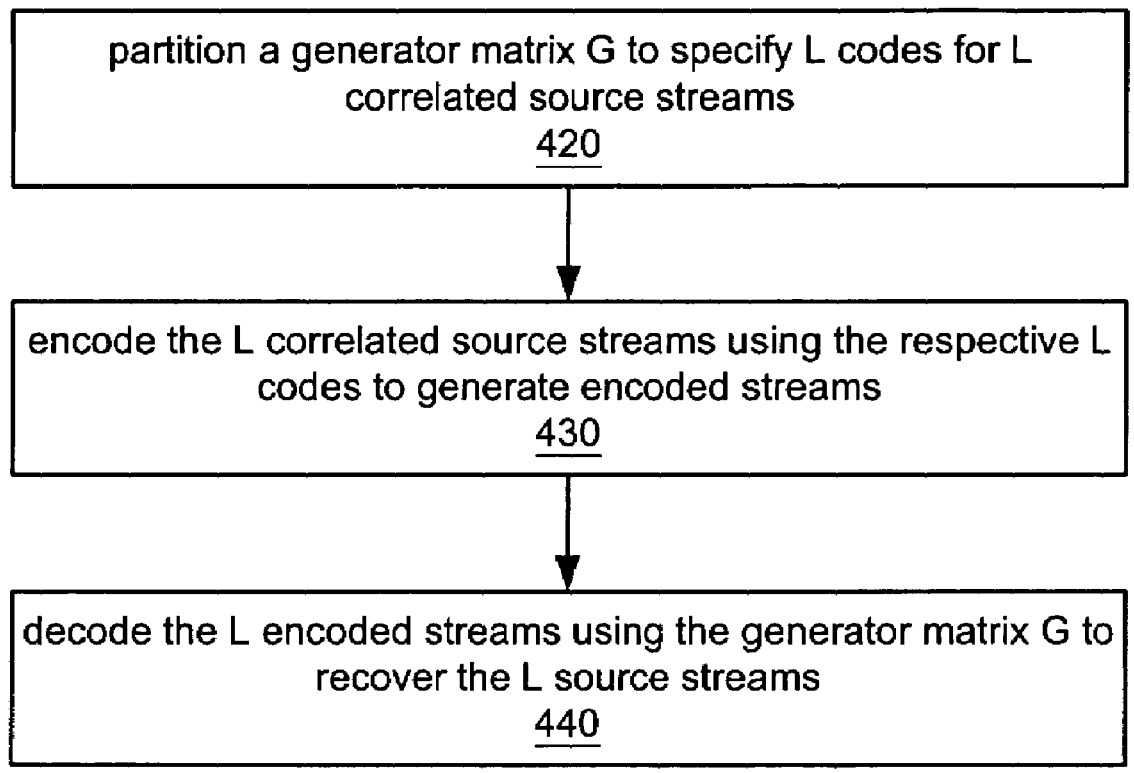
FIG. 4 is a flowchart diagram illustrating one embodiment of a method for Slepian-Wolf coding.
Figure 4A:
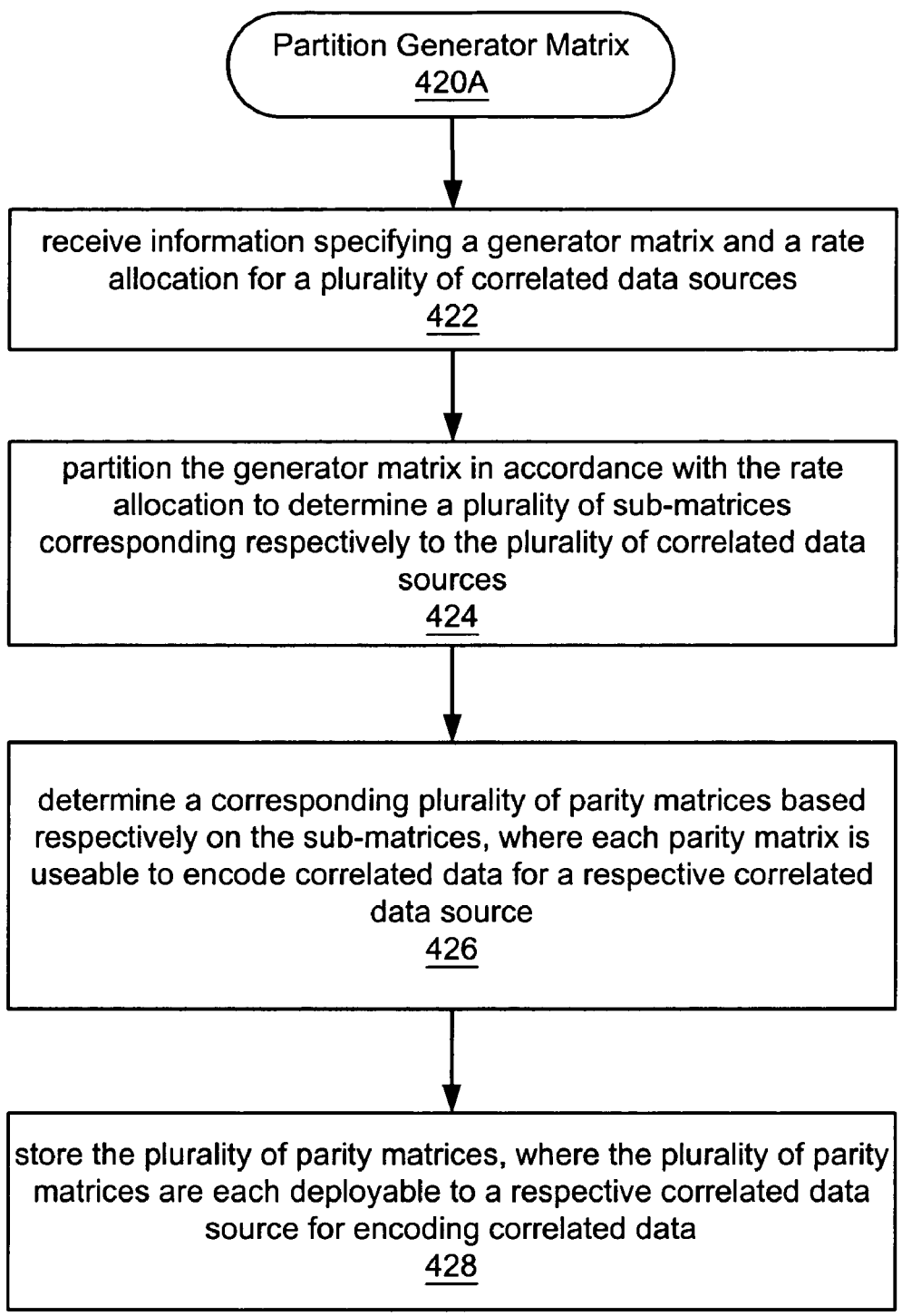
FIGS. 4A-4C flowchart more detailed embodiments of the method of FIG. 4.
Figure 4B:
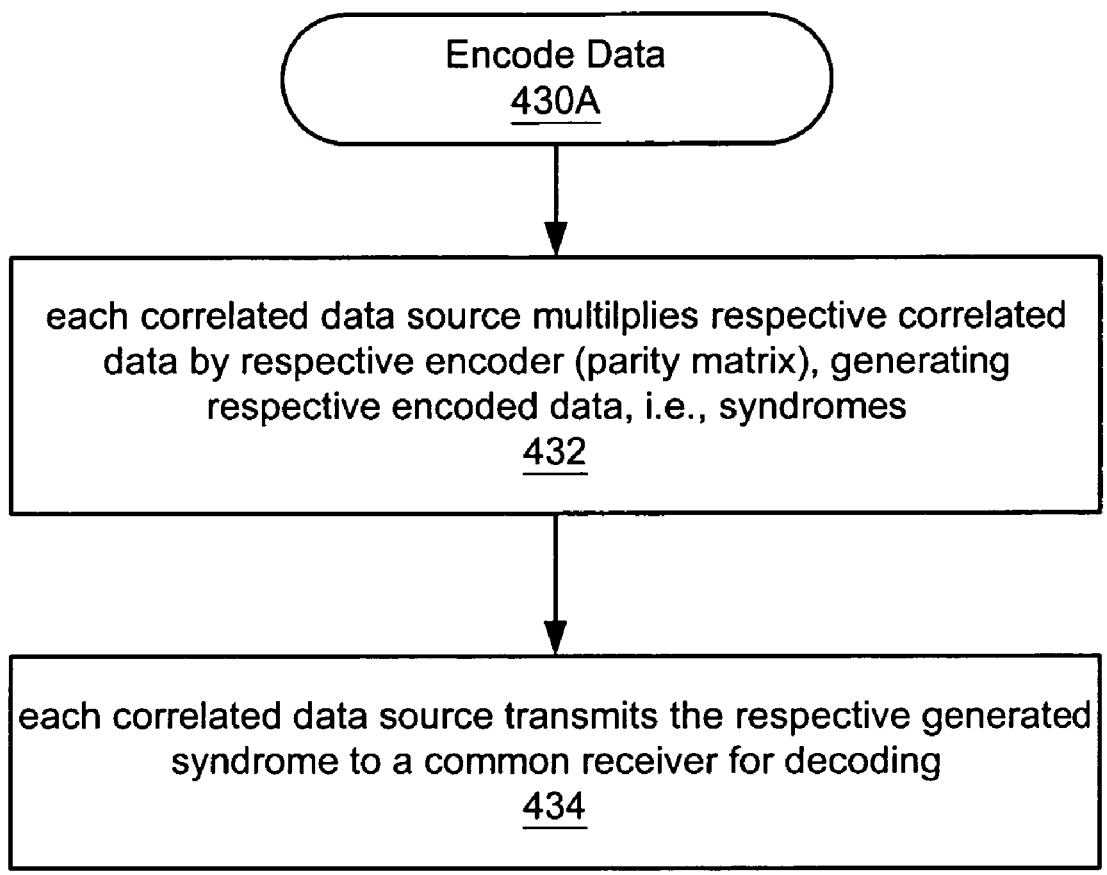
Figure 4C:
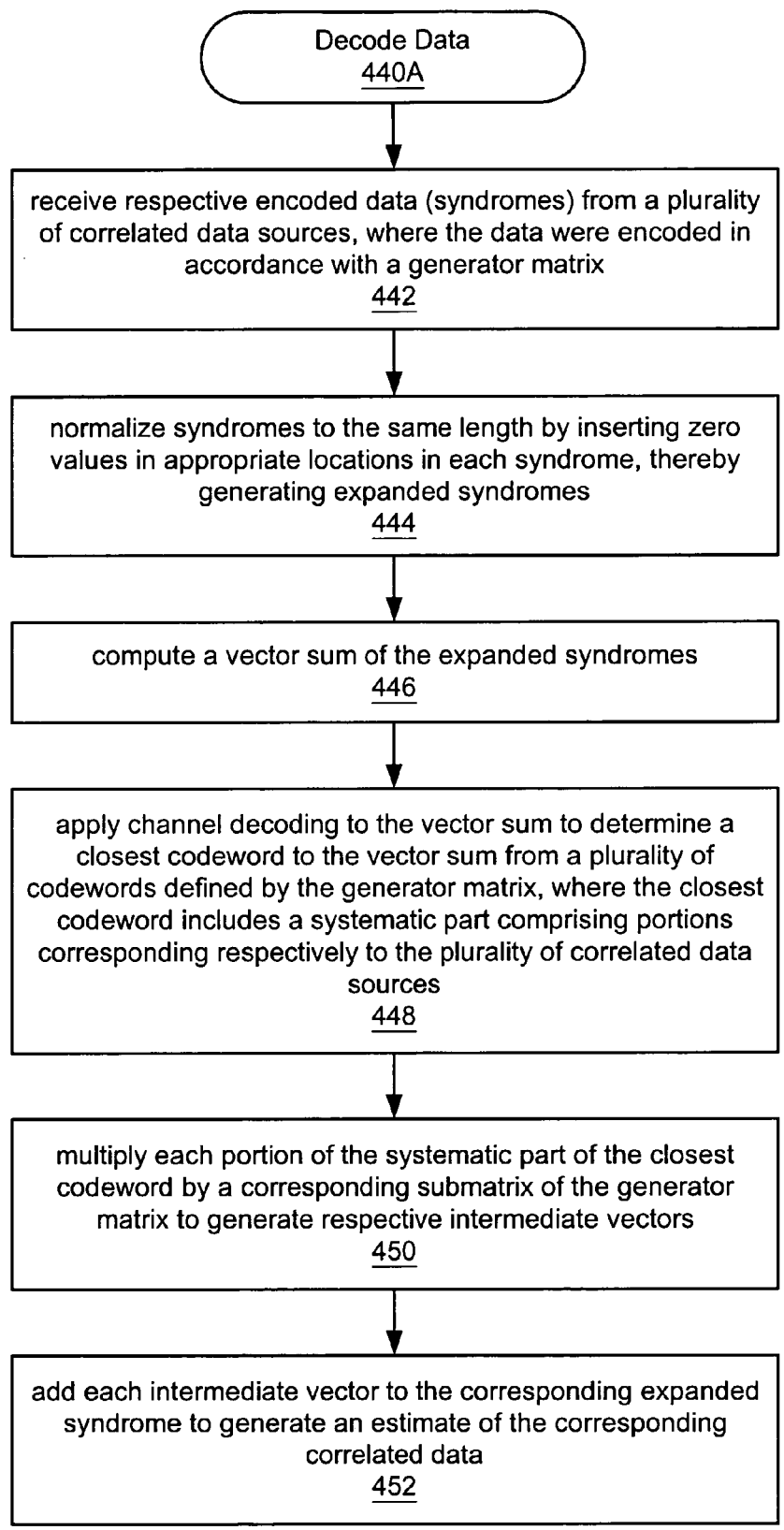

FIGS. 4-4C—Embodiments of a Method for Slepian-Wolf Coding for Multiple Data Sources FIG. 4 is a high-level flowchart of a method for implementing and using a system of encoders and a joint decoder, e.g., L encoders for L correlated sources, e.g., correlated data from L data sources, where L is an integer greater than or equal to two, according to one set of embodiments. In various embodiments, some of the method elements shown may be performed concurrently, in a different order than shown, or may be omitted. Additional method elements may also be performed as desired. More detailed embodiments are described below with reference to FIGS. 4A-4C. As shown, this method may operate as follows.

In 420, a generator matrix, e.g., generator matrix G, may be partitioned to specify L codes (including L encoders). Embodiments of a method for specifying the L codes, given the generator matrix G, are described more fully below with reference to FIG. 4A, and in the theoretical discussions presented later. It should be noted that it is the particular manner of partitioning that allows channel decoding (described below) to be performed singly, i.e., that allows a single channel decoding to be used.

In 430, correlated data from the L sources may be encoded using the L encoders, respectively. For example, in one embodiment, each of the L encoders may be deployed on respective correlated data sources or transmitters, which may then use the respective encoders to encode correlated data for that data source for transmission to a common receiver, where the common receiver includes a joint decoder. Note that as used herein, the term "correlated data source" may refer to a device or process that may generate or collect correlated data, and that may also include encoding and transmitting functionality for encoding and/or transmitting the correlated data, such as, for example, a smart sensor. In some descriptions, the term "source" may also refer to the source data, i.e., the correlated data itself. The particular context makes clear which use of the term is intended. Embodiments of a method for performing the encoding are described more fully below with reference to FIG. 4B.

In 440, the L encoded streams may be decoded to recover information generated by the L sources. For example, in one embodiment, the L encoded streams may be received by the common receiver mentioned above in 430, where a joint decoder may decode the encoded streams, thereby generating an estimate of the source data from each correlated data source. Embodiments of a method for performing the decoding are described more fully below with reference to FIG. 4C.

FIG. 4A—Method for Slepian-Wolf Coding for Multiple Data Sources: Partitioning

FIG. 4A flowcharts one embodiment of a method for data source coding. More specifically, FIG. 4A flowcharts a method for partitioning a Slepian-Wolf code for multiple data sources, where the data from the data sources are correlated, i.e., the sources are correlated data sources. In various embodiments, some of the method elements shown may be performed concurrently, in a different order than shown, or may be omitted. Additional method elements may also be performed as desired. As shown, this method may operate as follows.

In 422, information specifying a generator matrix, e.g., the generator matrix G of FIG. 4, and a rate allocation for a plurality of correlated data sources may be received. For example, in one embodiment, the generator matrix and rate allocation may be received from an external source, e.g., a computer system coupled to a network. In other embodiments, the generator matrix may be computed or determined, e.g., based on the correlations of the data. It should be noted that in preferred embodiments, the correlated data comprises binary data. Further details regarding the determination or computation of the generator matrix are provided below with reference to FIG. 5D.

In 424, the generator matrix may be partitioned to determine a plurality of sub-matrices corresponding respectively to the plurality of correlated data sources. The partitioning is preferably performed in accordance with the rate allocation for the plurality of correlated data sources. In one embodiment, the partitioning may include specifying or determining respective subsets of the generator matrix's rows corresponding to the respective rates of the correlated data sources. For example, a single row may be designated for a correlated data source with a high rate, and three rows may be designated for a correlated data source with a low rate. Note that, as is well known in the art of data coding, the rates in the rate allocation have a constant sum, so that for example, in a two-source embodiment, if one rate is low, the other will be high. Thus, depending on the particular rate allocation specified in 422, the generator matrix may be partitioned accordingly to generate respective sub-matrices corresponding to the correlated data sources.

As noted above with reference to FIG. 4, it is the particular manner of partitioning that allows channel decoding (described below) to be performed singly, i.e., that allows a single channel decoding to be used, as opposed to the multiple channel decodings required in other approaches, such as those of [35].

In 426, a corresponding plurality of parity matrices may be determined based respectively on the sub-matrices, where each parity matrix is useable to encode correlated data for a respective correlated data source. Thus, each parity matrix may be used by an encoder for encoding correlated data from or for a respective correlated data source. Further details of the generation of the parity matrices are provided below.

In 428, the plurality of parity matrices may be stored, e.g., in a memory medium of a computer system, where the plurality of parity matrices are each deployable to a respective correlated data source, e.g., a device such as a smart sensor, for encoding correlated data. In other words, once the parity matrices are determined, they may be deployable to respective correlated data sources for use in encoding data for transmission to a common receiver for joint decoding, described below with reference to FIGS. 4B and 4C.

It should be noted that in various embodiments, the parity matrices may be determined "on-board" the devices comprising or comprised in the correlated data sources, e.g., from the generator matrix, or may be determined elsewhere and deployed to the devices, e.g., at a central facility, or even by the common receiver, as desired.

FIG. 4B—Method for Slepian-Wolf Coding for Multiple Data Sources: Encoding

FIG. 4B flowcharts one embodiment of a method for encoding data using the parity matrices determined according to the method of FIG. 4A. As noted above, in various embodiments, some of the method elements shown may be performed concurrently, in a different order than shown, or may be omitted. Additional method elements may also be performed as desired. As shown, this method may operate as follows.

In 432, each of a plurality of correlated data sources may encode respective data by multiplying the respective correlated data by a respective parity matrix, described above with reference to FIG. 4A, resulting in respective encoded data. In a preferred embodiment, the respective encoded data may comprise a respective syndrome, as is well known in the art of data coding. Thus, each correlated data source may encode respective correlated data via the corresponding parity matrix to generate respective encoded data.

As noted above, such encoding may be used in any of a wide variety of different applications. For example, in a distributed sensor application, each of a plurality of smart sensors may include a respective encoder and transmitter. Each sensor may collect information from the environment comprising data that is correlated with data being collected by others of the sensors, and encode the data with the parity matrix (i.e., that sensor's parity matrix), e.g., by multiplying the correlated data (or some processed version of the correlated data) by the respective parity matrix, thereby generating the encoded data, e.g., a respective syndrome. Said another way, a correlated data block may be multiplied by the corresponding parity matrix to generate a corresponding encoded data block, i.e., a syndrome.

In 434, each correlated data source may transmit the respective encoded data or syndrome to a common receiver. For example, in the distributed sensor application, each sensor may transmit the encoded data to a central collector, e.g., a common receiver for joint decoding. In a preferred embodiment, each sensor may transmit the syndrome (encoded data) via wireless means, although any other means of transmittal may be used as desired.

It should be noted that in preferred embodiments, each correlated data source may operate to perform the above method in an iterative manner. For example, each correlated data source may stream data in blocks to a common receiver for joint decoding. For example, in a video distribution application, various correlated portions of video data may be encoded and transmitted to a common receiver iteratively, where the receiver may then (iteratively) joint-decode the received data and reconstruct the source data, e.g., in the form of streaming video, e.g., a movie. One embodiment of decoding is described below with reference to FIG. 4C.

FIG. 4C—Method for Slepian-Wolf Coding for Multiple Data Sources: Decoding

FIG. 4C flowcharts one embodiment of a method for decoding data encoded according to the methods of FIG. 4A and 4B. As noted above, in various embodiments, some of the method elements shown may be performed concurrently, in a different order than shown, or may be omitted. Additional method elements may also be performed as desired. As shown, this method may operate as follows.

In 442, respective encoded data (syndromes) may be received from a plurality of correlated data sources. For example, in relation to the methods described above with reference to FIGS. 4A and 4B, in a preferred embodiment, a common receiver may receive the transmitted respective encoded data, e.g., the encoded data block, from each of the plurality of correlated data sources. As noted above, in preferred embodiments, the encoded data block from each correlated data source comprises a respective syndrome. In some embodiments, each syndrome may be in the form of a binary vector, e.g., a vector whose elements have values of 0 or 1.

In 444, the syndromes may be normalized to a common length by inserting zero or more zero values at appropriate positions into each syndrome, thereby generating respective expanded syndromes. In other words, all of the syndromes generated and transmitted by the correlated data sources may not be of the same length, i.e., some syndromes may have more elements than others, and so zeroes may be inserted in appropriate locations to make all the syndromes have the same length.

In 446, a vector sum of the expanded syndromes may be computed. In preferred embodiments, the vector sum may be performed modulo 2, i.e., the binary vectors may be vector summed modulo 2, thereby generating the vector sum.

In 448, a single channel decoding may be applied to the vector sum to determine a closest codeword for the vector sum from a plurality of codewords, where the single channel decoding uses the generator matrix. For example, in some embodiments, the single channel decoding may be performed using a parity matrix derived from the generator matrix. As is well known in the art of coding, there is a one to one relationship between a generator matrix and its corresponding parity matrix.

It should be noted that in performing the single channel decoding step, any type of channel decoding may be used as desired. For example, there are a number of efficient channel decoding techniques that use iterative methods to determine a closest codeword without having to examine all the possible codewords defined by the generator matrix, including, for example, such techniques as iterative turbo decoding, iterative low-density parity check (LDPC) decoding, and iterative irregular repeat-accumulate (IRA) decoding, among others. It is further noted that this single channel decoding step is in direct contrast to prior art approaches, where multiple channel decodings are required to decode the data [35].

The closest codeword preferably includes a systematic part comprising a plurality (e.g., L) of portions corresponding respectively to the plurality (e.g., L) of sub-matrices of the generator matrix used to determine the respective parity matrices. While embodiments of the coding system and method described herein do not require use of the non-systematic part of the closest codeword, it should be noted that in some embodiments, the non-systematic part may be used for further utility, such as, for example, error correction. In other words, in some embodiments, the non-systematic part may be used to implement or use an error-correction protocol.

In 450, each of the plurality of portions of the systematic part of the closest codeword may be multiplied by a corresponding sub-matrix of the generator matrix to determine corresponding intermediate vectors.

In 452, each of the intermediate vectors may be added to a corresponding one of the expanded syndromes to obtain a corresponding output representing an estimate of the corresponding source data block.

Thus, the common receiver (via a joint decoder) may decode the received respective encoded data using the generator matrix, thereby generating decoded data, where the decoded data comprises estimates of the correlated data from each of the plurality of correlated data sources. As noted above, in preferred embodiments, the decoding described above may be repeated in an iterative manner to "stream" data, e.g., video data. Note further that in different embodiments, various of the computations described above may be performed by the common receiver, or may be performed by an external device, e.g., at a central facility, and the results deployed to the receiver. For example, in some embodiments, the receiver may store the generator matrix, and may compute the parity matrix from the generator matrix, and/or may determine the sub-matrices of the generator matrix, while in other embodiments, some or all of these computations may be performed elsewhere, e.g., at a central facility, by the correlated data sources (devices), etc., as desired, or as permitted by the computational resources available to each.

Figure 5A:
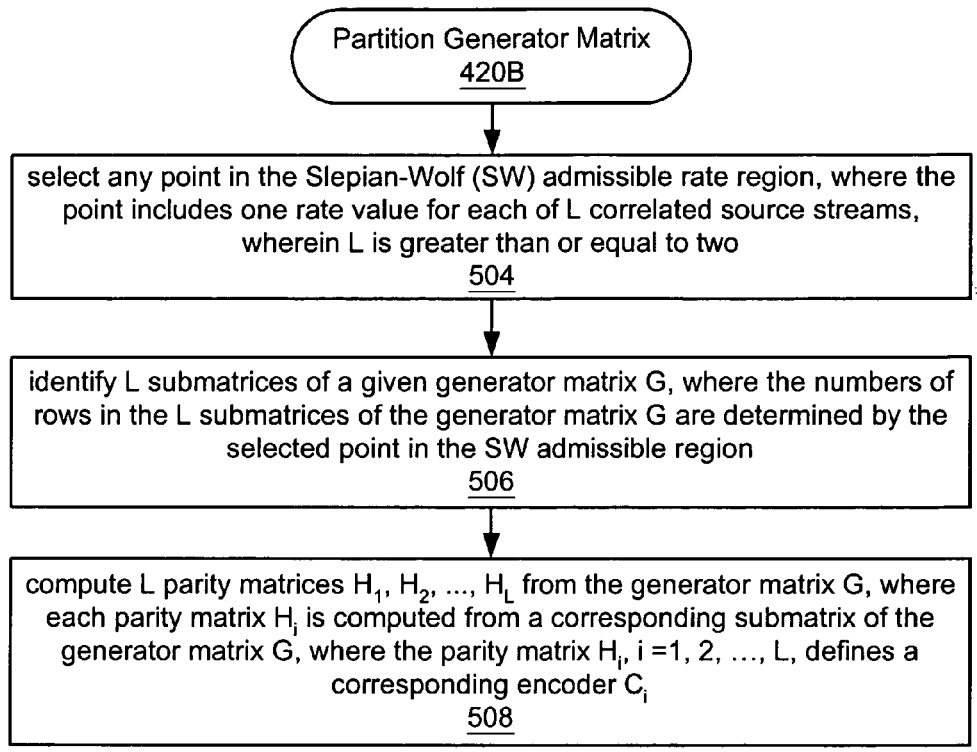
FIGS. 5A-5C flowchart additional detailed embodiments of the method of FIG. 4.
Figure 5B:
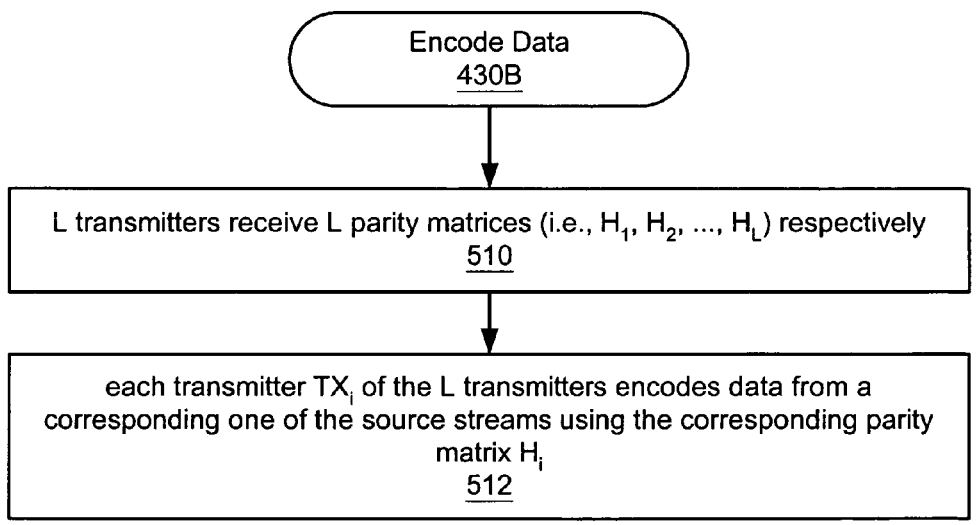
Figure 5C:
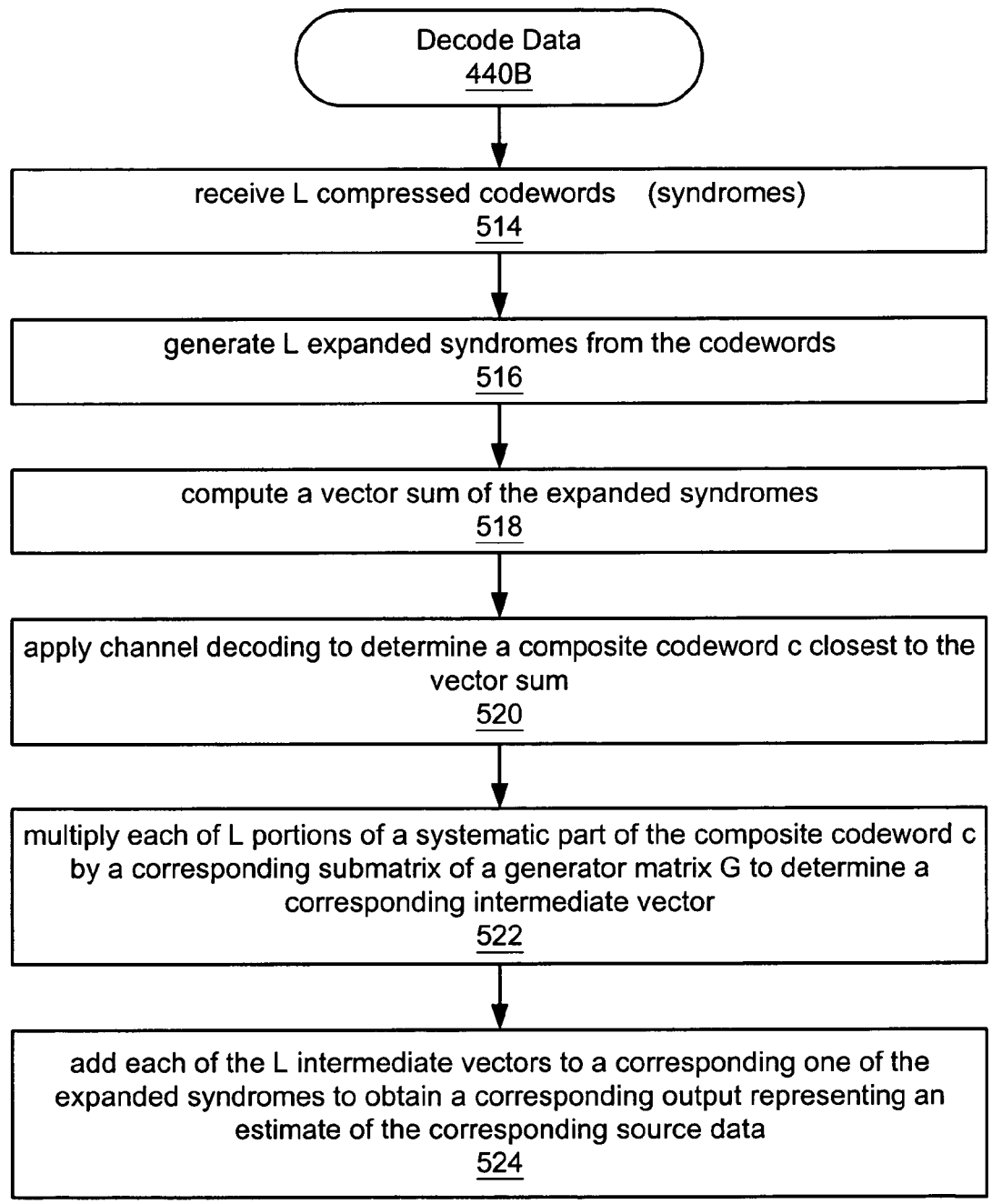
Figure 5D:
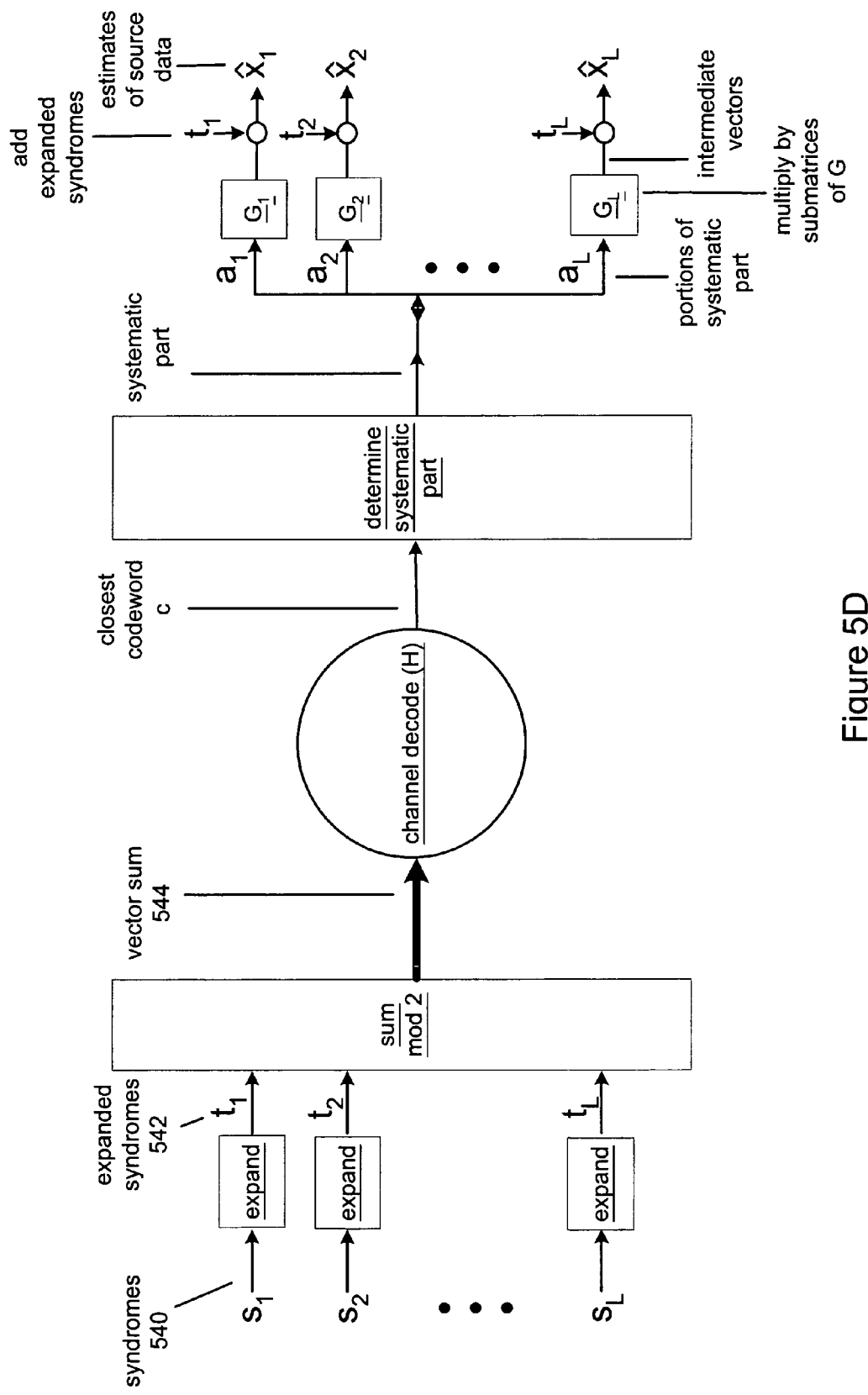
FIG. 5D is a high-level schematic diagram illustrating a decoding process, according to one embodiment of the present invention.

FIGS. 5A-5D—Further Embodiments of Slepian-Wolf Coding for Multiple Data Sources FIGS. 5A-5C flowchart further embodiments of the method of FIG. 4, which describes a method for implementing and using a system of encoders and a joint decoder, e.g., L encoders for L correlated sources, where L is an integer greater than or equal to two, according to one set of embodiments. FIG. 5D is a high-level schematic diagram illustrating one embodiment of a decoding process according to the method of FIG. 5C.

FIG. 5A—Method for Specifying Slepian-Wolf Codes for Multiple Data Sources

FIG. 5A illustrates one embodiment of a method for specifying L codes for L correlated source streams. In 504, any point in the Slepian-Wolf (SW) admissible rate region may be selected. The point includes one rate value for each of the L sources streams. L is an integer greater than or equal to one. For example, a point arbitrary close to the SW sum rate limit may be selected. In various embodiments, some of the method elements shown may be performed concurrently, in a different order than shown, or may be omitted. Additional method elements may also be performed as desired. As shown, this method may operate as follows.

In 506, L sub-matrices of a given generator matrix G may be identified. The L submatrices may be disjoint submatrices each having the same number of columns as the matrix G. The numbers of rows in the L submatrices of the generator matrix G are determined by the selected point in the SW admissible rate region. This process of identifying L submatrices of the generator matrix G is also referred to as partitioning the generator matrix G. See below for further description of how these submatrices are identified. As noted above, it is the particular manner of partitioning that allows channel decoding (described below) to be performed singly, i.e., that allows a single channel decoding to be used, as opposed to the multiple channel decodings required in other approaches, such as those of [35].

In 508, L parity matrices $H_1, H_2, \ldots, H_L$ may be computed from the generator matrix G. Each parity matrix $H_i$ is computed from a corresponding sub-matrix of the generator matrix G. The parity matrix $H_i$, i=1, 2, ..., L, defines a corresponding encoder $C_i$ according to the relation: $(s_i)^T = H_i (x_i)^T$, wherein $x_i$ represents a block of samples from the corresponding source stream, wherein si represents a syndrome generated by the encoder $C_i$.

FIG. 5B—Method for Slepian-Wolf Encoding of Multiple Data Sources

FIG. 5B illustrates one embodiment of a method for operating L transmitters, also referred to as correlated data sources, in order to encode L respective source streams, where L is an integer greater than or equal to two. In various embodiments, some of the method elements shown may be performed concurrently, in a different order than shown, or may be omitted. Additional method elements may also be performed as desired. As shown, this method may operate as follows.

In 510, each of the transmitters $TX_i$, i=1, 2, ..., L, may receive a corresponding parity matrix $H_i$ (e.g., computed as described above). In some embodiments, the respective parity matrices may be received directly by the transmitters, while in other embodiments, the transmitters may each receive a generator matrix and compute the respective parity matrix $H_i$ therefrom. Further details regarding the parity matrices are provided below.

In 512, each transmitter of the L transmitters may encode data from a corresponding one of the source streams using the corresponding parity matrix $H_i$. For example, each transmitter may encode data of a corresponding source stream according to the relation: $(s_i)^T = H_i (x_i)^T$, where $x_i$ represents a block of samples from the corresponding source stream, where $s_i$ represents a syndrome resulting from the encoding.

FIG. 5C—Method for Decoding Slepian-Wolf Encoded Data from Multiple Data Sources FIG. 5C illustrates one embodiment of a method for decoding L compressed streams of information, where L is greater than or equal to two. An overview of one embodiment of a decoding process according to this method is illustrates in the schematic diagram of FIG. 5D. In various embodiments, some of the method elements shown may be performed concurrently, in a different order than shown, or may be omitted. Additional method elements may also be performed as desired. As shown, this method may operate as follows.

In 514, a receiver may receive L codewords $s_1, s_2, \ldots, s_L$, i.e., syndromes 540 (e.g., from L respective transmitters), illustrated on the far left of FIG. 5D. The L codewords or syndromes 540 represent data from L information sources respectively, and may be produced or determined via a generator matrix G. Note that in preferred embodiments, the codewords or syndromes 540 are in the form of binary vectors.

In 516, the receiver may generate L expanded syndromes (also referred to herein as $t_1, t_2, \ldots, t_L$) 542 from the codewords $s_1, s_2, \ldots, S_L$ 540 by inserting zero or more zero values at appropriate locations (see discussion below) into each codeword, so that each of the expanded syndromes have the same length. In preferred embodiments, each of the expanded syndromes has a length equal to the length of the source realizations. Each respective expansion of syndrome $s_i$ to $t_i$ is represented by a corresponding "expand" block in FIG. 5D, where the respective expansions result in corresponding expanded syndromes 542.

In 518, the receiver may compute a vector sum 544 of the expanded syndromes, as shown in FIG. 5D. In preferred embodiments, the expanded syndromes are in the form of expanded binary vectors, and the vector sum is computed modulo 2.

In 520, the receiver may determine a composite codeword c of the channel code defined by the generator matrix G that is closest to the vector sum (e.g., in the sense of Hamming distance). As indicated in FIG. 5D, this closest codeword c is preferably determined via a single channel decoding step or process. In other words, only one channel decoding is required. It should be noted that any of various channel decoding techniques may be used as desired, including, but not limited to, block and convolutional decoding, e.g., turbo decoding and IRA decoding, among others, such decoding techniques being well known in the art. The single channel decoding process preferably utilizes a parity matrix H, which may be derived from the generator matrix G.

In 522, the receiver may multiply each of L portions of a systematic part of the composite (closest) codeword c by a corresponding sub-matrix of the generator matrix G to obtain a corresponding intermediate vector; thus, L intermediate vectors may be obtained altogether. The multiplication by these submatrices is represented in FIG. 5D by blocks $G_1, G_2, \ldots G_L$, resulting in the intermediate vectors, as shown.

In 524, the receiver may add each of the L intermediate vectors to a corresponding one of the expanded syndromes 542 to obtain a corresponding output $\hat{x}_i$ representing an estimate of the corresponding source data. Thus, the source data from each of the L data sources may be reconstructed from the closest codeword c.

Implementation Considerations

Various embodiments of the systems and methods described herein may be implemented in actual systems, e.g., distributed sensor networks, video distribution networks, etc., in any of a variety of ways. It should be noted that the particular implementations described are meant to be exemplary only, and are not intended to limit the invention to any particular set of implementations.

In some embodiments, the calculations required to partition the generator matrix and determine the parity matrices may not be very intensive, and so in embodiments where each transmitter (i.e., each correlated data source device) includes a microprocessor (or other computational resources, such as a programmable hardware element, application specific integrated circuit (ASIC), etc.), one may send a copy of the generator (G) matrix to each transmitter, and each transmitter may then compute its own sub-matrix $G_i$ and corresponding parity matrix $H_i$. Similarly, in some embodiments, one may send a copy of the G matrix to the receiver, and the receiver may compute the submatrices $G_1, G_2, \ldots, G_L$ and the parity matrix H. In other words, in various embodiments, depending upon the computational resources included in the devices respectively comprising the correlated data sources and the common receiver, the information deployed to each device may range from the generator matrix itself, e.g., generator matrix G, to any of various products derived from the generator matrix, e.g., submatrices $G_i$, parity matrix H, parity matrices $H_i$, and so forth. For example, in embodiments where the computation resources are slight, all the submatrices $G_1$, $G_2$, ..., $G_L$ and the corresponding parity matrices $H_1$, $H_2$, ..., $H_L$ may be computed at some central site, then the parity matrices $H_1$, $H_2$, ..., $H_L$ may be distributed to the respective correlated data sources or transmitters, and the submatrices $G_1$, $G_2$, ..., $G_L$ and parity matrix H sent to the receiver. It should be noted that in general, the single channel decoding performed by the receiver is computationally intensive, and so the receiver may require significantly more computational resources onboard than the various correlated data sources (devices).

It should be noted that any of various devices may be used to implement the techniques described herein, e.g., devices implementing the correlated data sources, encoders, transmitters, and common receiver. For example, as mentioned above, each correlated data source may include means for collecting or generating its respective correlated data (e.g., in the case of a distributed sensor network, one or more sensors), as well as an encoder, operable to apply the respective parity matrix to the data, and a transmitter, operable to transmit the encoded data to the receiver. These functionalities (and those of the receiver) may be implemented in any of various ways, including, but not limited to, a processor/memory (e.g., a microprocessor and memory), programmable hardware elements (e.g., field programmable gate arrays (FPGAs)), EEPROMs, integrated circuits (e.g., ASICs), and so forth, as desired.

Example Application

Low complexity and the inherent error detection capability make embodiments of the methods described herein particularly suitable for applications such as distributed sensor networks and video coding, among others. The method can be beneficially applied, for example, to the task of measuring temperature in an area, one embodiment of which is described below. It should be noted that the below example is meant to be exemplary only, and is not intended to limit the invention to any particular application domain or implementation.

Each encoder (measurement unit) may be equipped by a sensor (e.g., a security camera or a thermometer), a computer processor and a memory unit, and a transmitter. Each decoder (central unit or common receiver) may include a receiver and a computer.

First prior to communication, a suitable mathematical model for the correlation among the sources may be determined. The model is preferably be represented as a communication channel where the input is one source and the output is the other(s). This model may be determined by using samples of the processes (e.g., temperatures) taken over a substantial period of time. Then, a linear channel code with generator matrix G and parity matrix H may be designed based on some well-known channel code design techniques, such as density evolution using Gaussian approximation, for example. This may be performed via a computer software tool prior to communication and before all the encoders and the decoder are supplied with G (generator matrix) and H (parity matrix). Also, the encoders and the decoder preferably know transmission rates for each of the sources which are in accordance to the theoretical limit (i.e., the rate allocation for the data sources). Thus, each encoder has G, H, and transmission rates stored in its memory. Based on the transmission rate, each encoder (using its computer) computes a sub-matrix of G and its corresponding parity-check matrix.

The above functionality is preferably realized by a simple computer program. The resultant values are preferably stored in the memory of the computer.

At each encoder, the computer may be connected to the sensor, which senses the source and may perform A/D conversion (if necessary). In this way, the computer gets a source realization (e.g., the temperature value), which it multiplies by the parity-check matrix that corresponds to the stored sub-matrix of G. For this, computer software is preferably used (e.g., standard C/C++ programming language). Obtained values (syndrome vectors) may be modulated at the transmitter and sent.

The decoder may receive signals from all the encoders and may demodulate them. Then, the decoder may insert zeroes to all the resulting syndrome vectors, sum them, and run a channel decoder program (e.g., realized as a computer program) to apply a single channel decoding on the vector sum. Then, after some simple mathematical manipulations performed by the computer, all source realizations may be reconstructed. In this way, the decoder gets, for example, the temperatures in one area.

Below are provided detailed descriptions of the theoretical foundations for the above described methods, as well as simulation results indicating practical performance achieved by the methods described herein.

Slepian-Wolf Coding

Various embodiments of the present invention provide a method for designing, implementing, and using efficient practical non-asymmetric SW codes for coding multiple, memoryless, arbitrarily correlated binary sources. Necessary conditions have been determined to ensure that the decoding of all source messages can be performed using a single channel code. Detailed algorithms are provided for constructing such a code using parity-check matrices in several important cases when a single decoding suffices, including, for example: SW coding of two uniform sources, SW coding of multiple uniform sources with Bernoulli-p sum, compression (i.e., entropy coding) of a single source, and lossless coding of arbitrarily distributed source data with perfect side information at the decoder. After the publication of [30], [31], independently, a similar code design method for compressing two uniform sources was proposed in [32].

A primary benefit of the techniques described herein is to enable efficient and practical code designs using advanced channel codes capable of approaching any point on the theoretical bounds. To demonstrate a simple implementation of the proposed algorithms to linear channel codes, practical code designs are described based on powerful block (e.g., IRA) and convolutional (e.g., turbo) codes. By employing strong channel codes, such as irregular repeat-accumulate (IRA) [33] and turbo codes [34], to compress two and three uniformly distributed binary sources, experimental results are presented that are only 0.04 bit away from the SW bound, and thus, significantly outperform all previously reported experiments and approaches. Moreover, with the designs and techniques presented herein, performance loss is the same regardless of rate allocation among encoders and the number of compressed sources.

Additionally, it is shown that for coding nonuniformly distributed sources (i.e., source data with nonuniform statistical distribution), or more than two uniformly distributed, arbitrarily correlated sources, multiple channel codes are needed and, thus, the code design becomes more involved. An algorithm is provided for designing SW codes that can approach the theoretical limit in this general setting and its practical applicability discussed. Note that in general, for coding L sources, L different channel codes may need to be employed. Each additional channel code may increase the system's complexity and make the code design more difficult; thus, providing practical limit-approaching code designs in this case remains an open problem. However, it is shown herein that by reducing the number of employed codes, in some cases, the decoder can still reconstruct perfectly all the sources; achievable rate regions as a function of the number of employed codes are given; additionally, the inherent loss of the design based on a single channel code when employed in a general setup is described.

Recently, Schonberg, Pradhan, and Ramchandran [35] independently provided a similar extension of the theoretical approach of [Appendix G] to general correlations and multiple arbitrarily distributed sources. However, embodiments of the present invention are directed to efficient practical code design. Thus, a clear description of the code design algorithms in terms of parity-check matrices is described; given the parity-check matrix of any linear channel code, it is straightforward to construct nonasymmetric SW codes. More importantly, directions for searching/designing efficient practical SW codes of the lowest possible complexity are given. Whereas in [35] statements are only hinted (without rigorous proofs), optimality of the disclosed algorithms is proved herein. Moreover, the concepts described herein may offer a new decoding perspective of the problem of decoding, enabling one to clearly distinguish the cases when a single channel code can be used for decoding all the sources. It should be noted that this particular aspect of the present techniques is of particular benefit, as otherwise, the code construction becomes rather impractical.

Apart from the SW setup, for lossless MT networks (even in the simplest cases [5], [6], [7], [8], [9], [10]) no practical coding scheme has yet been proposed. By extending the approach, code designs are presented for the general lossless MT source coding networks [12], [13] that include an arbitrary number of encoders and decoders. The main idea is to split the MT network into subnetworks, each being an SW coding system with multiple sources, to design a code for each subnetwork, and then to combine these codes into a single general MT code. The presently described code designs obtained this way are capable of approaching the theoretical limits in some special cases.

Below are described certain theoretical results upon which the practical code construction techniques are based. The code construction techniques are then described in detail, followed by consideration of several exemplary cases: the case of SW coding of multiple uniformly distributed sources, compression of a single source, source coding with perfect side information, SW coding of two nonuniform sources and multiple arbitrarily correlated sources. The extension to general lossless multiterminal network is also provided. Practical implementations based on IRA and turbo codes are also described. Finally, experimental results and conclusions are given.

Practical Slepian-Wolf Coding

Regarding notation, in the below descriptions, random variables are denoted by capital letters, e.g., X, Y. They take values from finite alphabets X,Y. Realizations of random vectors of finite length n bits $X^n$, $Y^n$ are denoted by lower-case letters, e.g., $(x,y) \in (X^n, Y^n)$. For a given set S, $|S|$ denotes the cardinality of S. As described herein, all variables and channel codes are binary, although it should be noted that the principles described herein may be generalized to bases greater than 2. For clarity of exposition, compression of two sources is considered first, then a simple extension to multiple sources is provided.

Compression of Two Sources

Let $\{X_i, Y_i\}_{i=1}^\infty$ be a sequence of independent drawings of a pair of independent, identically distributed (i.i.d.), discrete, correlated binary random variables (X, Y) with probability density function p(x,y). The task is to compress X and Y separately at a minimum possible rate, so that a joint decoder can recover them perfectly. Encoder mappings are given by: $e_1: X^n \to \{1, 2, \ldots, 2^{nR_1}\}$ and $e_2: y^n \to \{1, 2, \ldots, 2^{nR_2}\}$, and a decoder mapping is:

$$g: \{1, 2, \ldots, 2^{nR_1}\} \times \{1, 2, \ldots, 2^{nR_2}\} \to x^n \times y^n, \quad (1)$$

where $R_1$ and $R_2$ are the rates used for compressing X and Y, respectively. Slepian and Wolf [1] showed that the achievable rate region for this distributed source coding problem is given by $$R_1 \geq H(X|Y), R_2 \geq H(Y|X), R_1 + R_2 \geq H(X,Y) \quad (2)$$

The proof of the Slepian-Wolf theorem is based on a random coding argument and exploits the asymptotic equipartition property (AEP) and joint typicality [28]. The main idea is to partition the spaces $X^n$ and $Y^n$ into $2^{nR_1}$ and $2^{nR_2}$ sets (called bins), respectively, and to randomly assign every source realization $x \in X^n$ to one of $2^{nR_1}$ bins and every source realization $y \in Y^n$ to one of $2^{nR_2}$ bins. The assignments are known to the encoders and the decoder. Each encoder transmits the index of the bin to which its source realization belongs. Given the received index pair, the decoder searches in the two bins for a jointly typical (x,y) pair. If it succeeds to find such a unique pair, then it reconstructs the sources as $(\hat{x}, \hat{y}) = (x,y)$; otherwise an error is declared.

It can be shown [28] that if the transmission rates satisfy (2), then for large enough n, there exist encoding and decoding mappings, $e_1, e_2$, and g that can make the probability of decoding error $P_e^{(n)} = \Pr(g(e_1(X^n), e_2(Y^n)) \neq (X^n, Y^n))$ arbitrarily small.

The proof of the SW theorem shows that a coding scheme that can reach the SW bound exists, but does not show how to construct such a scheme. Wyner [5] suggested realization of the binning scheme for asymmetric SW coding, i.e., source coding with perfect side information at the decoder, using channel codes, where each bin is a coset [36], [37] of a good parity-check code indexed by its syndrome. This algebraic binning scheme is described in detail in [29].

Wyner's scheme has been extended to nonasymmetric SW coding by Pradhan and Ramchandran [27], [Appendix G] by employing generalized coset codes [38]. The idea underlying the method of [Appendix G] is to partition a single linear channel code C into two non-overlapping subcodes for independent encoding of two uniformly distributed sources X and Y. The subcodes, $C_1$ and $C_2$, are constructed in such a way that the set of coset representatives of $C_1$ in C is taken as $C_2$. $C_1$ and $C_2$ are then used to construct an algebraic binning scheme for encoding $X^n$ and $Y^n$, respectively. For a random variable $Q \in Q$, let $B_Q^i$ be the set of all $q \in Q^n$ that belong to bin i. Then, realizations of $X^n$, $x \in X^n$, are put into bins $B_X^i$, $i=1, \ldots, 2^{nR_1}$, each being a coset code of $C_1$, whereas realizations of $Y^n$, $y \in Y^n$ are put into bins $B_Y^j$, $j=1, \ldots, 2^{nR_2}$, each being a coset code of $C_2$. If the main code C is constructed for the correlation among X and Y, then such a code construction ensures that for each index pair (i,j), there is only one typical pair (x,y) (i.e., the pair that satisfies the correlation model), such that $x \in B_X^i$ and $y \in B_Y^j$, as long as the rates used for coding X and Y, $R_1$ and $R_2$, respectively, satisfy the SW bound (2). For example, if the correlation among the sources is such that $w_H(X^n \oplus Y^n) \leq t$, where $w_H(.)$ is the Hamming weight and $\oplus$ is addition in GF(2), then a linear t-error correction channel code employed for SW coding of X and Y ensures error-free decoding and can approach the SW bound [Appendix G]. Thus, a single code may be used for decoding both sources.

Extending this result, the constraint of [Appendix G] that X and Y must be uniformly distributed is removed, and methods presented that enable the design of efficient nonasymmetric SW codes in the general setup [4]. Since each encoder encodes its source separately, it forms an algebraic binning scheme on a channel code. However, to exploit a single code for decoding two sources, the decoder should construct a single algebraic binning scheme on a channel code by combining information received from the two encoders. The main idea is that the decoder first forms a binning scheme for reconstructing the modulo-2 sum of the sources; then will try to recover the sources without further decoding. The next proposition gives conditions when this is possible.

Let an auxiliary random variable $U \in \mathcal{U}$ be given by $U = X \oplus Y$. Then, the new decoder function is defined as:

$$g': \{1, 2, \ldots, 2^{nR_1}\} \times \{1, 2, \ldots, 2^{nR_2}\} \to U^n \quad (3)$$

Proposition 1: Suppose that rates $R_1$ and $R_2$ used for coding X and Y, respectively, satisfy the SW bound (2). Let $w_H(U^n) \leq t$ and $|U^n| \leq H(X^n, Y^n)$, and let C be a linear t-error correction code. Then, 1. There exists a decoder g', based on an algebraic binning scheme formed on channel code C, that can recover $\hat{u} = \hat{x} \oplus \hat{y} = u = x \oplus y$ error-free;

2. if X and Y are uniformly distributed, the decoder can reconstruct error-free $\hat{x} = x$ and $\hat{y} = y$ from $\hat{u} = u$ without further decoding;

3. if X and Y are nonuniformly distributed, then they cannot be reconstructed error-free using a single channel code for decoding.

Parts 2 and 3 give sufficient and necessary conditions when two i.i.d. sources can be decoded using a single channel code. Part 2 follows from [27], [Appendix G].

Proof. The proof of Part 1 is given, based on [1], [Appendix G]. The proof of Part 3 is described below, where it is shown how to construct code C. Encoding is performed as in [35]: the (n,k) linear channel code C is partitioned into two sub-codes $C_1$ and $C_2$. The first encoder encodes x with $C_1$ and sends the obtained $nR_1$-length syndrome $s_X$ (index i of the bin to which x belongs); similarly, the second encoder encodes y using $C_2$ and sends the $nR_2$-length syndrome $s_Y$ (index j of the bin to which y belongs). (Note that, there are at least $2^{nH(X,Y)}$ pairs of bins $(B_X^i, B_Y^j)$, $i \in \{1, \ldots, 2^{nR_1}\}$, $j \in \{1, \ldots, 2^{nR_2}\}$.) However, at receiver side, the joint decoder constructs a new algebraic binning scheme based on C only, that is, it forms cosets of C (bins), such that their coset leaders [29] (elements with minimum Hamming weight) are $u = x \oplus y \in U^n$.

This is feasible since $w_H(X^n \oplus Y^n) \leq t$ and the minimum Hamming distance of C is t. Each coset contains $2^k$ codewords, and the number of such cosets is at most $$\sum_{i=0}^{t} \binom{n}{i} = |u^n|.$$

Note, $$\log_2 \sum_{i=0}^{t} \binom{n}{i} \geq H(U^n),$$

with equality if $U^n$ is uniformly distributed. Thus, we have $$H(X^n, Y^n) \geq \log_2 \sum_{i=0}^{t} \binom{n}{i} \geq H(U^n).$$

Since the rates are achievable [1], $nR_1 \geq H(X^n|Y^n)$, $nR_2 \geq H(Y^n|X^n)$, and $n(R_1+R_2) \geq H(X^n, Y^n)$ hold. Given $s_X$ and $s_Y$ (i.e., indices i and j) and knowing unique mappings $$(B_X^i, B_Y^j) \to B_U^h \left( h \in \left\{ 1, \ldots, \sum_{i=0}^{t} \binom{n}{i} \right\} \right),$$

the decoder can reveal h, the index of the bin to which $u = x \oplus y$ belongs. (This is always possible because the decoder receives at least $$H(X^n, Y^n) \geq \log_2 \sum_{i=0}^{t} \binom{n}{i} \geq H(U^n) \text{ bits}$$

from the two encoders.) Then, it recovers $\hat{u}$ as a coset leader of the determined bin. The decoder can achieve this by forming an n-length vector t, a codeword of the h-th coset of C. This coset is a shifted version of C by vector u. Thus, t is a shifted version of a codeword $c \in C$ by u, i.e., $c = t \oplus u$. Since the Hamming distance of code C is 2t+1, among all codewords of C, c is closest to t. Thus, by decoding t on C, c is obtained, and the distance between these two vectors is $\hat{u} = c \oplus t = x \oplus y$.

Recall that the scheme of [Appendix G] is proposed for compressing two uniformly distributed i.i.d. sources. (The existence of such a scheme is advocated by Part 2 of Proposition 1.) However, Part 3 states that a similar single decoding scheme for nonuniform sources cannot be constructed.

Compression of Multiple Sources

The extension of the SW theorem to multiple sources and ergodic processes is given in [3], [4]. Let $X_1, \ldots, X_L$ be i.i.d., discrete, correlated random variables; then $x_1, \ldots, x_L$ are realizations of $X_1^n, \ldots, X_L^n$, respectively. The i-th encoder compresses $X_i^n$ at rate $nR_i$ independently from the information available at other encoders. The decoder receives the bitstreams from all the encoders and jointly decodes them. It should reconstruct all received source messages with arbitrarily small probability of error. The achievable rate region for this SW problem with multiple sources is [4]:

$$R_{i_1} + \ldots + R_{i_k} \geq H(X_{i_1}, \ldots, X_{i_k} | X_{j_1}, \ldots, X_{j_{L-k}}) \quad (4)$$

where for $k \leq L$, $\{i_1, \ldots, i_k\} \subseteq \{1, \ldots, L\}$ and $\{j_1, \ldots, j_{L-k}\} = \{1, \ldots, L\} \setminus \{i_1, \ldots, i_k\}$.

Now the extension of Proposition 1 to multiple sources is presented. First for k=1, ..., L, auxiliary random variables $U_k \epsilon U_k$ are defined such that $U_k = X_{i_1} \oplus X_{i_2} \oplus \ldots \oplus X_{i_k}$, where $\{i_1, i_2, \ldots, i_k\} \subseteq \{1, 2, \ldots, L\}$. Then, the decoder functions are $$g'_k: \{1, 2, \ldots, 2^{nR_1}\} \times \{1, 2, \ldots, 2^{nR_2}\} \times \ldots \times \{1, 2, \ldots, 2^{nR_{ik}}\} \rightarrow U_k^n \quad (5)$$

Proposition 2: Suppose that i.i.d. sources $X_1, \ldots, X_L$ are compressed at rates $R_1, \ldots, R_L$, respectively, which satisfy (4). Let $w_H(U_L^n) \leq t$ and $|U_L^n| \leq H(X_1^n, \ldots, X_L^n)$, and let C be a linear t-error correction code. Then, 1. There exists a decoder $g_L'$, based on an algebraic binning scheme formed on a channel code C, that can recover $\hat{u}_L = x_1 \oplus \ldots \oplus \hat{x}_L = u_L = x_1 \oplus \ldots \oplus x_L$ error-free;

2. if $X_1, \ldots, X_L$ are uniformly distributed and there exists $i \epsilon \{1, \ldots, L\}$ such that $$H(X_1, \ldots, X_L) = L - 1 + H(X_i | X_1, \ldots, X_{i-1}, X_{i+1}, \ldots, X_L), \quad (6)$$

then the decoder can reconstruct error-free all the sources from $\hat{u}_L = u_L$ without further decoding;

3. otherwise, such a decoder does not exist.

The proof of Part 1 is omitted since it follows directly from the extension of the SW theorem given in [4]. Parts 2 and 3 give sufficient and necessary conditions when L i.i.d. sources can be decoded on a single channel code. The proof of Part 2 follows from the construction of code C. Rigorous proofs of Parts 2 and 3 are provided below.

From Part 3, it follows that compressing L i.i.d. uniform or nonuniform, arbitrarily correlated sources, while approaching the theoretical limit, is possible in practice solely by employing multiple algebraic binning schemes, i.e., multiple decodings. Since introducing additional decoding (channel code) requires new code designs (possibly, with new parameters), a channel code $C_i$ is assigned to each decoder function $g_i'$ and an optimal decoding scheme is defined as the one that minimizes the number of employed channel codes. Then, the optimal algebraic binning-based scheme for compressing L i.i.d. arbitrarily correlated and arbitrarily distributed sources may operate in the following way. (For simplicity, it is assumed that all the sources are statistically identical, thus, the numeration is irrelevant.)

1. Channel code $C_L$ (which constructs the first algebraic binning scheme) reconstructs $\hat{u}_L$ ($u_L = x_1 \oplus \ldots \oplus x_L$). If the sources cannot be recovered unambiguously from $\hat{u}_L$, then this information is forwarded (reducing uncertainty) to the next channel code.

2. Channel code $C_{L-1}$ finds $\hat{u}_{L-1}$ (where $u_{L-1} = x_1 \oplus \ldots \oplus x_{L-1}$). If the sources cannot be recovered unambiguously from $\hat{u}_{L-1}$ and $\hat{u}_L$, then it forwards its information (and thus reduces uncertainty) to the next channel code.

3. The procedure is the same for channel codes i=3, ..., L-2. Given $\hat{u}_3, \ldots, \hat{u}_{L-1}$, and $\hat{u}_L$, $C_2$ constructs $\hat{u}_2$ (where $u_2 = x_1 \oplus x_2$).

4. Assuming that the sources are nonuniform, channel code $C_1$ reconstructs $\hat{x}_1 = \hat{u}_1$.

5. Given $\hat{x}_1, \ldots, \hat{x}_{i-1}$, and $\hat{u}_i$, $C_i$ recovers $\hat{x}_i$.

Note that the optimal decoding scheme operates in L successive steps. In each step, the employed channel code exploits a part of the whole correlation only. All channel codes together exploit the whole correlation. Indeed, code $C_i$ forms $\hat{u}_i$ by exploiting probability density function $p(u_i) = p(x_1 \oplus \ldots \oplus x_i)$. Since $H(U_i) \leq H(X_1, \ldots, X_i)$ [28], in general, the whole correlation among the sources is not exploited.

For example, suppose that X and Y are two nonuniform i.i.d. random variables of length one bit. Then, $C_2$ decodes $U_2 = X \oplus Y$ using probability density function $p(u_2)$. For symmetric correlations, i.e., $Pr(X=i|Y=j) = Pr(X \neq i|Y \neq j)$, i, j $\epsilon \{0, 1\}$, $P(u_2)$ becomes $p(x|y)$, so only the conditional distribution among X and Y is exploited. The remaining correlation is the marginal distributions of the sources, i.e., $p(x)$ and $p(y)$, which is exploited by code $C_1$ in the second decoding step. However, besides the marginal distributions, $C_1$ uses information about the already recovered $\hat{u}_2$.

A similar "symmetric" correlation condition for k ($k \geq 2$) i.i.d. sources is given by:

$$Pr(X_1 = a | X_{i_2} = x_2, \ldots, X_{i_k} = x_k) = Pr(X_1 \neq a | X_{j_2} = x_2, \ldots, X_{j_k} = x_k) \quad (7)$$

for all subsets $\{i_2, \ldots, i_k\} \epsilon \{1, \ldots, L\}$ and $\{j_2, \ldots, j_k\} \epsilon \{1, \ldots, L\}$, such that $x_{i_2} \oplus \ldots \oplus x_{i_k} = b$ and $x_{j_2} \oplus \ldots \oplus x_{j_k} \neq b$, where a, b $\epsilon \{0, 1\}$. For example, for k=3, (7) becomes:

$$Pr(X_1 = 1 | X_2 = 0, X_3 = 0) = Pr(X_1 = 1 | X_2 = 1, X_3 = 1)$$
$$= Pr(X_1 = 0 | X_2 = 0, X_3 = 1)$$
$$= Pr(X_1 = 0 | X_2 = 1, X_3 = 0)$$

and $$Pr(X_1 = 0 | X_2 = 0, X_3 = 0) = Pr(X_1 = 0 | X_2 = 1, X_3 = 1)$$
$$= Pr(X_1 = 1 | X_2 = 0, X_3 = 1)$$
$$= Pr(X_1 = 1 | X_2 = 1, X_3 = 0)$$

Then, code $C_k$ uses the conditional distribution among the k sources, $p(x_k | x_1, \ldots, x_{k-1})$. It is easy to see that in this case $H(U_k) = H(X_1 | X_2, \ldots, X_k)$. If (7) holds for each $k \epsilon \{1, \ldots, L\}$, then using the chain rule [28] results in:

$$H(X_1, \ldots, X_L) = H(X_1) + H(X_2 | X_1) + \ldots + H(X_L | X_1, \ldots, X_{L-1})$$
$$= H(U_1) + H(U_2) + \ldots + H(U_L),$$

where $U_1 = X_1$.

Code Construction

Detailed algorithms are now presented for designing optimal decoding schemes for the general SW coding problem as discussed in [4]. From a practical point of view, it is important to distinguish two cases: first, the case when a single channel code can be used for decoding all sources; and second, the situation when multiple decodings are needed. In contrast to the first case where practical SW codes can be efficiently designed to approach the theoretical limits, in the second case the code design becomes more involved and often impractical. Thus, a description of the code design algorithms when a single code can be used for decoding are first provided, and a proof of Part 2 of Proposition 2 is presented. Some examples are provided regarding when decoding on a single code can approach the theoretical limits. Then, Part 3 of Proposition 2 is proved and a more general code construction provided based on overlapping subcodes of the main code which requires multiple decoding steps to recover the sources. However, it is noted that this design method can approach the theoretical limits in the most general setup, i.e., for multiple sources, arbitrary correlation models, and arbitrary source distributions. Instead of using completely different channel codes, one code will be designed, and its subcodes used, as suggested in [Appendix G]. Note that although this solution may be more elegant, it may not always be more efficient in practice.

In the descriptions that follow, $I_k$ designates the $k \times k$ identity matrix, and $O_{k_1 \times k_2}$ denotes the $k_1 \times k_2$ all-zero matrix. Given a vector x, |x| denotes its length, and $x^i$ is its i-th bit, i=1, ..., |x|.

Decoding with a Single Channel Code

Multiple Uniformly Distributed Sources

In some embodiments of the present invention, a code may be constructed that can approach the bound (4) for any achievable rate allocation among the encoders by exploiting a single decoding at the receiver side. For clarity, systematic channel codes are used, and a simple extension to non-systematic codes is presented. Consider the following definition:

Definition 1: A unique SW code for coding sources $X_1, \ldots, X_L$ at rates $R_1, \ldots, R_L$, respectively, is a pair (C, M), where C is an (n,k) linear channel code given by generator matrix $G_{k \times n}$, and M is an ordered set of integers $\{m_1, \ldots, m_L\}$ such that $$\sum_{j=1}^{L} m_j = k,$$

where $m_j = n - nR_j$.

For each $i \in \{1, \ldots, L\}$, code $C_i$, may be formed as a subcode of the main code C with $m_i \times n$ generator matrix $G_i$ which consists of $m_i$ rows of G starting from row $m_1 + \ldots + m_{i-1} + 1$. (Although the selection of $m_i$ rows is irrelevant as long as they are linearly independent of those taken by any other subcode, for simplicity it is assumed that $G_1$ contains the first $m_1$ rows of G, and so forth.) Let $m_{i-} = m_1 + \ldots + m_{i-1}$ and $m_{i+} = m_{i+1} + \ldots + m_L$. Then, for $G = [I_k P_{\kappa'(v-\kappa)}]$, the generator matrix of subcode $C_i$ is:

$$G_i = [O_{m_i \times m_{i-}} I_{m_i} O_{m_i \times m_{i+}} P_{i_{m_i} \times (n-k)}] \quad (8)$$

where $P^T = [P_1^T \ldots P_L^T]$.

One choice for the $(n-m_i) \times n$ parity matrix $H_i$ of $C_i$ is:

$$H_i = \begin{bmatrix} I_{m_{i-}} & O_{m_{i-} \times m_i} & O_{m_{i-} \times m_{i+}} & O_{m_{i-} \times (n-k)} \\ O_{m_{i+} \times m_{i-}} & O_{m_{i+} \times m_i} & I_{m_{i+}} & O_{m_{i+} \times (n-k)} \\ O_{(n-k) \times m_{i-}} & P_i^T & O_{(n-k) \times m_{i+}} & I_{n-k} \end{bmatrix} \quad (9)$$

Encoding is simply the multiplication of the incoming n-length vector $$x_i = [u_i \, a_i \, v_i \, q_i] \quad (10)$$

(vectors $u_i$, $a_i$, $v_i$, and $q_i$ are of length $m_{i-}$, $m_i$, $m_{i+}$, and n−k, respectively) with the parity matrix $H_i$. In this way the syndrome vector $s_i^T = H_i x_i^T$ of length $n-m_i$ is formed as:

$$s_i^T = \begin{bmatrix} u_i^T \\ v_i^T \\ q_i^T \oplus P_i^T a_i^T \end{bmatrix} \quad (11)$$

Let a length n row-vector $t_i$ be defined as $$t_i^T = \begin{bmatrix} u_i^T \\ O_{m_i \times 1} \\ v_i^T \\ q_i^T \oplus P_i^T a_i^T \end{bmatrix} \quad (12)$$

Then, $x_i \oplus t_i = a_i G_i$ is a valid codeword of $C_i$, and thus also of C.

The decoder collects all syndromes $s_1, \ldots, s_L$ and forms the sum $t = t_1 \oplus \ldots \oplus t_L$. From linearity, it follows that $x_1 \oplus t_1 \oplus \ldots \oplus x_L \oplus t_L$ is a valid codeword of C. The task of the decoder is then to find a codeword that is closest (in Hamming distance) to vector t. Such a codeword $c \in C$ may be found by decoding t on the main code C. Let the vector $[\hat{a}_1 \ldots \hat{a}_L]$ be the systematic part of c. The sources may then be recovered as: $\hat{x}_i = \hat{a}_i G_i \oplus t_i$.

(Note that if Decoding is Error-Free, then this Step is Perfect.)

Given the length of the messages n, the number of encoders L, and the set of desirable transmission rates $R_1, \ldots, R_L$ (that are achievable [4]), parameters of the unique SW code may be selected in the following way. For $i=1, \ldots, L$, $m_i = n - nR_i$, $$k = \sum_{j=1}^{L} m_j.$$

If the joint distribution of the sources is such that $w_H(x_1 \oplus \ldots \oplus x_L) \leq t$, then the code C should be an (n,k) code that can correct at least t errors; thus, the Hamming distance of the code is $d_H \geq 2t+1$, and from the sphere packing bound $$n - k \geq \log \sum_{j=0}^{t} \binom{n}{j} \text{ holds.}$$

Proposition 3: If the parameters of a unique SW code (C,M) are selected as above and the joint distribution of the sources $X_1^n, \ldots, X_L^n$ is given by $w_H(x_1 \oplus \ldots \oplus x_L) \leq t$, then the decoding error equals zero.

Proof: The proof follows directly from Proposition 2 and the discussion above. Note that if the correlation is given by $w_H(x_1 \oplus \ldots \oplus x_L) \leq t$ only, and all realizations $(x_1, \ldots, x_L)$ that satisfy the correlation are uniformly distributed, then the code can reach the SW bound.

An advantage of this technique is that only one good channel code is needed. Proposition 3 may be extended to cover arbitrary correlation models among two uniform sources. Indeed, as long as the main code C captures completely the correlation among the sources, the unique SW code approaches the theoretical limit.

For clarity, an example of the code construction is provided for the case L=2 using a systematic channel code (a similar example but with a non-systematic code is hinted at in [27], [Appendix G]). Let $X^n$ and $Y^n$ be two discrete i.i.d. uniformly distributed vectors of length n=7 bits such that the Hamming distance between them is at most one bit and $H(Y^n|X^n)=3$ bits. The source messages are separately encoded and sent to a joint decoder, whose task is to losslessly reconstruct both of them. The SW bound for this case is 10 bits [1]. It can be achieved in the asymmetric scenario by transmitting one source, e.g., X, at rate $nR_1=H(X'')=7$ bits and by coding the second source Y at $nR_2=H(Y''|X'')=3$ bits. It is shown how the same total rate may be achieved by using $nR_1=nR_2=5$ bits. Since n=7 bits, and a code is needed that can correct at least one bit error, for a unique SW code C the systematic (7,4) Hamming code is selected, defined by the generator matrix:

$$G_{k \times n} = [I_4 P] = \begin{bmatrix} 1000101 \\ 0100110 \\ 0010111 \\ 0001011 \end{bmatrix}.$$

Its parity matrix is:

$$H = \begin{bmatrix} 1110100 \\ 0111010 \\ 1011001 \end{bmatrix}.$$

Further two subcodes of C, $C_1$ and $C_2$, may be constructed by splitting G into two generator matrices, $G_1$ that contains the first m=2 rows of G, and $G_2$ that contains the last two rows. (Note that this construction ensures nonoverlapping among subcodes.) X may be coded using $C_1$ and Y using $C_2$. Let $P^T=[P_1^T P_2^T]$. Then for the (n−m)×n parity-check matrices $H_1$ and $H_2$ of $C_1$ and $C_2$, respectively, (9) produces:

$$H_1 = \begin{bmatrix} O_{m \times m} & I_m & O_{m \times (n-k)} \\ P_1^T & O_{(n-k) \times m} & I_{n-k} \end{bmatrix} = \begin{bmatrix} O_{m \times m} & I_{n-m} \\ P_1^T & \end{bmatrix} = \begin{bmatrix} 0010000 \\ 0001000 \\ 1100100 \\ 0100010 \\ 1000001 \end{bmatrix}$$

$$H_2 = \begin{bmatrix} I_m & O_{m \times m} & O_{m \times (n-k)} \\ O_{(n-k) \times m} & P_2^T & I_{n-k} \end{bmatrix} = \begin{bmatrix} 1000000 \\ 0100000 \\ 0010100 \\ 0011010 \\ 0011001 \end{bmatrix}$$

since both $H_1$ and $H_2$ have rank n−m and $H_1 G_1^T = H_2 G_2^T = O_{(n-m) \times m}$.

Let realizations of the sources be x=[0010110] and y=[0110110]. Since the Hamming distance between x and y is one bit, according to Proposition 3, it should be possible to decode the messages correctly.

Syndromes may be formed for both x and y. To do so, x and y may be written in the form:

$$x=[a_1 \, v_1 \, q_1]=[00 \, 10 \, 110], \, y=[u_2 \, a_2 \, q_2]=[01 \, 10 \, 110].$$

The length n−m syndromes, $s_1$ and $s_2$, formed by the two subcodes are $$s_1^T = H_1 x^T = \begin{bmatrix} v_1^T \\ P_1^T a_1^T \oplus q_1^T \end{bmatrix} = [10110]^T,$$

$$s_2^T = H_2 y^T = \begin{bmatrix} u_2^T \\ P_2^T a_2^T \oplus q_2^T \end{bmatrix} = [01001]^T.$$

The length n row-vectors $t_1$ and $t_2$ may now be given by:

$$t_1^T = \begin{bmatrix} O_{m \times 1} \\ v_1^T \\ P_1^T a_1^T \oplus q_1^T \end{bmatrix} = [0010110]^T$$

$$t_2^T = \begin{bmatrix} u_2^T \\ O_{m \times 1} \\ P_2^T a_2^T \oplus q_2^T \end{bmatrix} = [0100001]^T.$$

The row-vectors $x \oplus t_1$ and $y \oplus t_2$ are then codewords of the codes $C_1$ and $C_2$, respectively.

Thus, receiving $s_1$ and $s_2$ from the two encoders, the joint decoder finds the codeword c in C that is closest to $t=t_1 \oplus t_2=$[0110111]. Since there is no error in decoding, this codeword will be $c=x \oplus t_1 \oplus y \oplus t_2=$[0010111] because the Hamming distance between x and y is one bit and the minimal Hamming distance of the code C is three. The corresponding reconstructions $\hat{a}_1=a_1$ and $\hat{a}_2=a_2$ are then obtained as the systematic part of the codeword c. Since $a_1 G_1 = x \oplus t_1$ and $a_2 G_2 = y \oplus t_2$, the sources are reconstructed as $\hat{x}=\hat{a}_1 G_1 \oplus t_1=$[0010110]$=a_1 G_1 \oplus t_1$ and $\hat{y}=\hat{a}_2 G_2 \oplus t_2=$[0110110]$=a_2 G_2 \oplus t_2$. Thus, it may be seen that x and y are indeed recovered error-free.

With a simple modification, the method may be applied to non-systematic linear block codes. Indeed, due to linearity the generator matrix of the main code C, which is now non-systematic, may be written in the form $G=[A \, P_{k \times (n-k)}]$, where A is a k×k matrix of rank k (invertible matrix), by rearranging its columns if necessary. Define a k-length coded vector as:

$$V_{SW}=[a_1 a_2 \ldots a_L] \quad (13)$$

Let a k-length row-vector $b_i$ be defined as:

$$b_i = V_{SW} \begin{bmatrix} O_{m_i - \times m_i} \\ O_{k \times m_i -} & I_{m_i} & O_{k \times m_i +} \\ O_{m_i + \times m_i} \end{bmatrix} A^{-1} = [O_{1 \times m_i -} \, a_i \, O_{1 \times m_i +}] A^{-1},$$

where $A^{-1}$ is the matrix inverse of A.

The syndrome vector $S_i$ may now be formed as:

$$s_i^T = \begin{bmatrix} u_i^T \\ v_i^T \\ q_i^T \oplus P^T b_i^T \end{bmatrix}. \quad (14)$$

Let an n-length row-vector $t_i$ be defined as $$t_i^T = \begin{bmatrix} u_i^T \\ O_{m_i \times 1} \\ v_i^T \\ q_i^T \oplus P^T b_i^T \end{bmatrix}. \quad (15)$$

For each $i \in \{1, \ldots, L\}$, $x_i \oplus t_i = b_i G$ is a valid codeword of C.

The decoder may collect all syndromes $s_1, \ldots, s_L$ and form the sum $t = t_1 \oplus \ldots \oplus t_L$. The codeword of C that is closest to the vector t is now $[\hat{a}_1 \ldots \hat{a}_L \hat{g}]$, where $\hat{g}$ is a row-vector of length n–k. The decoder may recover vector $b_i$ as: $\hat{b}_i=[O_{1\times m_i}\ \hat{a}_i\ O_{1\times m_{i_t}}]A^{-1}$. Finally, the sources may be reconstructed as: $\hat{x}_i = \hat{b}_i G \oplus t_i$.

Note that this method also applies to the case when C is a convolutional code, as will be shown below in an example with punctured turbo codes.

Compression of a Single Source

SW coding may be viewed as conditional entropy coding with side information. In the absence of side information, an SW coder becomes an entropy coder. Thus it is reasonable to assume that the described unique SW code can work as an entropy coder in the absence of the second source message. Indeed, to compress nonuniformly distributed source X to rate $R \geq H(X)$ a linear t-error correction (n,k) block code C with $k \leq n(1-H(X))$ may be used. Suppose that C is systematic and its generator matrix is given by: $G=[I_k P_{k\times(n-k)}]$. Construct $2^{n(H(X)+\epsilon)}$ cosets of C as shifts of C by all typical sequences x. Let x=[a q], where a and q are row-vectors of length k and n–k, respectively. The encoder may form the (n–k)-length syndrome vector as $s=aP \oplus q$. Then, n-length row-vector $t=[O_{1\times k}\ aP \oplus q]$ is a codeword of the coset of C whose coset leader is x (see the proof of Part 1 of Proposition1). Thus, the decoder may find a codeword c in C that is closest to t. Finally, the source may be reconstructed as: $\hat{x}=c \oplus t$. Consider the following proposition.

Proposition 4: The i.i.d. source X with distribution modeled as $w_H(x) \leq t$ can be compressed using a linear t-error correction (n,k) channel code C, $k \leq n(1-H(X))$, so that the decoding error equals zero.

Proof: Note that the number of typical sequences of X is upper bounded by $2^{n(H(X)+\epsilon)}$ [28]. Then, the proof follows directly from Proposition 1 and the discussion above. Note that the code C can reach the entropy limit, i.e., the compression rate $R \geq H(X)$, if all source realizations that satisfy distribution model $w_H(x) \leq t$ are equally likely.

Source Coding with Side Information

In this case, i.i.d. arbitrarily distributed source X may be compressed and sent to the decoder, which has access to side information Y. The code design algorithm may be as described above for L=2, $m_1=k$, and $m_2=0$ (a corner point). Note that the decoder now sets $t_2=y$.

The Design of an Efficient Main Code

Although in the cases considered so far, a single channel code can be used for decoding of all sources, the selection/design of such codes may differ. In the previous examples, it was assumed that the correlation among sources is given by a Hamming weight $w_H(.)$ and unique SW codes were designed that were capable of providing zero-error decoding while approaching and even reaching the theoretical limits. More realistic correlation models are now considered, where, for example, the probability of decoding error can only be made arbitrarily small, i.e., zero-error lossless compression may not be guaranteed, as the methods of [39], [40]. Instead, channel coding may be used to achieve lossless compression with a vanishing probability of error as the length of the employed channel code approaches infinity.

Suppose that $X^n$ and $Y^n$ are two n-length i.i.d. discrete correlated random sources with joint probability density function $$p(x, y) = \prod_{k=1}^{n} p(x^k, y^k).$$

The correlation among the sources is given by $Pr(X=i,Y=j) = Pr(X=i)Pr(Y=j|X=i)$, for all $i,j \in \{0,1\}$. To facilitate the channel code design, an equivalent way of presenting this correlation may be exploited using a correlation channel with the input being X and the output Y. Such a channel is described by crossover probabilities $Pr(Y \neq i|X=i)$, $i \in \{0,1\}$. Thus, for $j \in \{0,1\}$, $Pr(Y=j)=\Sigma_{i \in \{0,1\}}Pr(X=i)Pr(Y=j|X=i)$. (Note that to completely describe the correlation among the sources, in addition to the information about the channel, the statistics of X are also needed.)

Suppose that realizations of the sources are given by: $x=[a_1\ v_1\ q_1]$ and $y=[u_2\ a_2\ q_2]$, where $|a_1|=|u_2|=m_1$, $|v_1|=|a_2|=k-m_1$, and $|q_1|=|q_2|=n-k$ bits. Assuming an (n,k) systematic main code C with generator matrix $G=[I_k\ P_{k\times(n-k)}]$, the n-length row-vector t is given by (12): $t=[u_2\ v_1[a_1\ a_2]P \oplus q_1 \oplus q_2]$. Then, as previously described, t may be decoded (on C) for $c=[a_1\ a_2[a_1\ a_2]P] \in C$. Thus, the input to the decoder is t and the output is reconstruction $\hat{c}$. This may be viewed as the following communication problem. A sequence of bits $c^k$, $k=1,\ldots,n$, is transmitted over a virtual communication channel; the output of the channel is sequence $t^k$. The decoder task is to reconstruct the sent message c from the received sequence $t^k$. From the previous discussion, it may be seen that if a code C approaches the capacity on such a virtual communication channel, then when employed in the corresponding SW compression problem, the theoretical limits may be approached.

Consider first the case when the correlation channel among uniform sources $X^n$ and $Y^n$ is a binary symmetric channel (BSC) with crossover probability $p_c=Pr(Y=i|X\neq i)$, $i \in \{0,1\}$. Then, the virtual communication channel is exactly the correlation channel, i.e., $P_{vc}=Pr(T=i|C\neq i)=p_c=Pr(Y=i|X\neq i)$. From the channel coding theorem [28], it follows that to allow reliable communication over a channel, the transmission rate must be less than or equal to channel capacity. Since capacity of BSC with crossover probability p is $1-H(p)$ [28], where $H(p)=-p\log_2 p-(1-p)\log_2(1-p)$, it follows that:

$$C_c = 1 - H(p_c) = 1 - H(X|Y) \geq R_t = \frac{k}{n}.$$

(Note that the transmission rate over this channel is the code rate of the employed (n,k) main code C.) And thus: $k \leq n(1-H(X|Y))=n(1-H(p_c))$.

It may thus be concluded that if a linear code C approaches the capacity of a BSC, then a unique SW code (C, M) will approach the SW limit as long as the joint correlation between $X^n$ and $Y^n$ can be modeled with the same BSC.

In the case of compressing K multiple uniform sources with the correlation given only by the fact that $X_1 \oplus \ldots \oplus X_K$ is a Bernoulli-p process, in a similar way, a correlation channel may be defined as a BSC with the input being one source, e.g., $X_1$, and the output being $X_2 \oplus \ldots \oplus X_K$. Then, the crossover probability of this channel is $p_c=p=Pr(X_2 \oplus \ldots \oplus X_K=i|X_1=i)$, $i \in \{0,1\}$. It may be said that such a channel is "determined" by $X_1 \oplus \ldots \oplus X_K$. Note that the virtual communication channel, i.e., the channel whose input is vector $c=[a_1 \ldots a_K[a_1 \ldots a_K]P]$ (see $x_i$ as used in (10)) and output vector t (as used in (12)), is a BSC with the same crossover probability, i.e., $P_{vc}=Pr(T=i|C\neq i)=p_c=p$. Again, using the channel coding theorem provides:

$$C_c = 1 - H(p) =$$

$$1 - H(X_1 | X_2 \oplus \ldots \oplus X_K) \stackrel{(1)}{=} 1 - H(X_1 | X_2, \ldots, X_K) \geq R_t = \frac{k}{n},$$

where (1) follows from the fact that the correlation is given solely by $Pr(X_1 \oplus \ldots \oplus X_K=1)=p$ and $Pr(X_1 \oplus \ldots \oplus X_K=0)=1-p$. From this, $k \leq n(1-H(X_1|X_2,\ldots,X_K))$ may be obtained. Thus, if an (n,k) linear code C approaches the capacity of a BSC with crossover probability p, then a unique SW code (C,M) can approach the joint entropy limit in this setup.

The compression problem described above may be addressed in a similar way. The correlation and virtual communication channels are the same and given by a BSC with crossover probability $Pr(X\neq 0)$.

Suppose now that X is nonuniform and Y is side information given to the decoder (see above). Let the correlation channel be a BSC with crossover probability $p=p_c=Pr(Y=i|X\neq i)$, $i\in\{0,1\}$. Because now $m_1=k$, i.e., $|v_1|=|a_2|=0$, the n-length row-vectors $t_1$ and t are $t_1=[0_{1\times m_1} a_1 P \oplus q_1]$ and $t=[u_2 a_1 P \oplus q_1 \oplus q_2]$. t is decoded for a vector $c=t\oplus x\oplus y=[a_1 \ a_1 P]\in C$; thus, the virtual communication channel is a channel with input C and output T. Since in this case $H(X|Y)\leq H(p)$, there is a performance loss of $H(p)-H(X|Y)$ for a decoder that exploits $p(x\oplus y)$ only. To exploit all available information, the decoder should reconstruct the sources by maximizing $$p(c|t) = \frac{p(t|c)p(c)}{p(t)}.$$

For the systematic part of the codeword (the first k bits) and for the non-systematic part (remaining n–k bits) if $T_1=0$, the decoder has to decode based on:

$$\frac{Pr(C=0|T=1)}{Pr(C=1|T=1)} = \frac{Pr(X=0|Y=1)}{Pr(X=1|Y=1)} = \frac{qp_c}{(1-q)(1-p_c)}$$

and $$\frac{Pr(C=1|T=0)}{Pr(C=0|T=0)} = \frac{Pr(X=1|Y=0)}{Pr(X=0|Y=0)} = \frac{(1-q)p_c}{q(1-p_c)},$$

where $q=Pr(X=0)$. If $T_1=1$ for the non-systematic part the decoder computes the log-likelihood ratios (LLR's) based on:

$$\frac{Pr(C=0|T=1)}{Pr(C=1|T=1)} = \frac{Pr(X=1|Y=0)}{Pr(X=0|Y=0)} = \frac{(1-q)p_c}{q(1-p_c)}$$

and $$\frac{Pr(C=1|T=0)}{Pr(C=0|T=0)} = \frac{Pr(X=0|Y=1)}{Pr(X=1|Y=1)} = \frac{qp_c}{(1-q)(1-p_c)}.$$

In summary, in all considered cases a main channel code is designed for a given single virtual communication channel. If a channel code is good for such a channel, then it will also work well in the corresponding SW setup.

Decoding with Multiple Channel Codes

A unique SW code may enable reconstruction of all sources by decoding on a single code. However, this code may approach the theoretical limits only in some special cases. In general, multiple decodings are needed on different channel codes. Since code construction now becomes more involved, for the sake of clarity, code design (i.e., design for the generator matrix) for two nonuniform sources is now described in detail, followed by description of the extension of the approach to multiple sources in general. Similar designs are given in [35], although it is noted that the designs of [35] require multiple channel decodings, in contrast with the present invention, in which only a single channel decoding is required and used.

Two Nonuniformly Distributed Sources

For SW coding of two i.i.d. nonuniformly distributed sources X and Y we must combine the techniques proposed for compression and for SW coding of two uniform sources. However, in this case to approach the theoretical limit we must allow overlapping of the subcodes used for encoding the sources. Indeed, assume that $X^n$ and $Y^n$ are compressed with generator matrices $G_1$ and $G_2$ containing $m_1$ and $m_2$ linearly independent rows of G, respectively, where G is the k×n generator matrix of the main systematic code C, and $m_1+m_2=k$ (no overlapping). Since $$R_1 = \frac{n-m_1}{n}$$

and $$R_2 = \frac{n-m_2}{n},$$

from the SW bound [1], it follows that $n(R_1+R_2)=2n-k=n+n-k\geq nH(X,Y)=nH(Y)+nH(X|Y)$. Because the capacity of the virtual communication channel in this case is bounded by $1-H(X|Y)$, $n-k\geq nH(X|Y)$ obtains. From this and $nH(Y)<n$, it follows that $n(R_1+R_2)$ is strictly larger than $nH(X,Y)$; thus, in this setting, the joint entropy limit may not be approached as advocated by the SW theorem. (See also [35].) Note that sharing the rows among the subcodes, i.e., their overlapping is allowed. Assuming $H(Y)>H(X)$, the generator matrices $G_1$ and $G_2$ of the two subcodes of C, $C_1$ and $C_2$, will share $n(1-H(Y))$ rows of G. This part may be used to compress $Y^n$. Additional $n(H(Y)-H(X))$ rows may be added to $G_2$ to form a part used for compression of $X^n$. The remaining $n(H(X)-H(X|Y))$ rows of G may be split among $G_1$ and $G_2$ to obtain the desired rate allocation. Thus, $k=n(1-H(Y)+H(Y)-H(X)+H(X)-H(X|Y))=n(1-H(X|Y))$, which satisfies the capacity constraint $n-k\geq nH(X|Y)$. Note that the achieved sum-rate $n(R_1+R_2)=2n-k=n+nH(Y)=n(H(Y)+H(X|Y))=H(X,Y)$ approaches the SW bound.

Exploiting this row sharing and following the same approach as in the previous subsection, vector $\hat{x}\oplus\hat{y}$ may be deconstructed after decoding on the main code C (i.e., using G) only. It should be noted, however, that the sources can not be recovered from this vector. Indeed, for simplicity, assume $H(X)=H(Y)<1$, then the generator matrices of subcodes $C_1$ and $C_2$, $G_1$ and $G_2$, contain the first $m_{11}=m_{21}$ rows of G (compression part); $G_1$ contains additional $m_{12}$ rows of G and $G_2$ the remaining $m_{22}$ rows; thus, $k=m_{11}+m_{12}+m_{22}$. Suppose again that the generator matrix of the main code C is given by $G=[I_k P_{k\times(n-k)}]$. Additionally, $P^T=[P_{11}^T P_{12}^T P_{22}^T]$, where $P_{11}$ contains $m_{11}$ rows, $P_{12}$ $m_{12}$ rows, $P_{22}$ $m_{22}$ rows of P. Let realizations of the sources be $x=[a_{11} a_{12} v_1 q_1]$ and $y=[a_{21} u_2 a_{22} q_2]$, where $|a_{11}|=|a_{21}|=m_{11}=m_{21}$, $|a_{12}|=|u_2|=m_{12}$, $|v_1|=|a_{22}|=m_{22}$, and $|q_1|=|q_2|=n-k$. Note that vectors $a_{11}$ and $a_{21}$ are used for compression, and they occupy the same position in the source vectors. Let $P_1^T=[P_{11}^T P_{12}^T]$ and $P_2^T=[P_{11}^T P_{22}^T]$; then the syndromes and vectors $t_1$ and $t_2$ may be reformed as:

$$s_1^T = \begin{bmatrix} v_1^T \\ q_1^T \oplus P_1^T [a_{11} a_{12}]^T \end{bmatrix} \quad (16)$$

$$s_2^T = \begin{bmatrix} u_2^T \\ q_2^T \oplus P_2^T [a_{21} a_{22}]^T \end{bmatrix} \quad (17)$$

and $$t_1^T = \begin{bmatrix} 0_{(m_{11}+m_{12})\times 1} \\ v_1^T \\ q_1^T \oplus P_1^T [a_{11} a_{12}]^T \end{bmatrix} \quad (18)$$

$$t_2^T = \begin{bmatrix} 0_{m_{21}\times 1} \\ u_2^T \\ 0_{m_{22}\times 1} \\ q_2^T \oplus P_2^T [a_{21} a_{22}]^T \end{bmatrix}. \quad (19)$$

After decoding vector $t=t_1 \oplus t_2$ on C, the decoder gets codeword $\hat{c}=t\oplus\hat{x}\oplus\hat{y}=[\hat{a}_{11}\oplus\hat{a}_{21}\ \hat{a}_{12}\ \hat{a}_{22}\ [\hat{a}_{11}\oplus\hat{a}_{21}\ \hat{a}_{12}\ \hat{a}_{22}]P]$. Note that in this decoding step, the decoder should exploit all the available information; for example, for the first $m_{11}$ bits, the decoder may compute the LLR's based on:

$$\frac{Pr(C=1|T=0)}{Pr(C=0|T=0)} = \frac{Pr(X\neq Y)}{Pr(X=Y)};$$

for the next $m_{12}$ bits, the decoder may use:

$$\frac{Pr(C=1|T=0)}{Pr(C=0|T=0)} = \frac{Pr(X=1|Y=0)}{Pr(X=0|Y=0)} \text{ and}$$

$$\frac{Pr(C=0|T=1)}{Pr(C=1|T=1)} = \frac{Pr(X=0|Y=1)}{Pr(X=1|Y=1)};$$

the next $m_{22}$ bits may be decoded based on:

$$\frac{Pr(C=1|T=0)}{Pr(C=0|T=0)} = \frac{Pr(Y=1|X=0)}{Pr(Y=0|X=0)} \text{ and}$$

$$\frac{Pr(C=0|T=1)}{Pr(C=1|T=1)} = \frac{Pr(Y=0|X=1)}{Pr(Y=1|X=1)};$$

finally, for the remaining n−k bits (non-systematic part), similarly to the case of coding a nonuniform source with side information at the decoder, the decoder should separately consider different cases depending on the values of random variables $T_1$ and $T_2$. After obtaining $\hat{c}$, the decoder can reconstruct solely $\hat{a}_{12}$ and $\hat{a}_{22}$. To recover vectors $\hat{a}_{11}$ and $\hat{a}_{21}$, one more decoding may be needed, this time on a subcode $C_{11}$ of C whose generator matrix contains the first $m_{11}$ rows of G. A row-vector $t_1^{(2)}$ may then be formed from $t_1=t_1^{(1)}$ by canceling the effect of already recovered vector $\hat{a}_{12}$ to the last (n−k) bits of $t_1$; that is, $$t_1^{(2)T} = \begin{bmatrix} 0_{(m_{11}+m_{12})\times 1} \\ 0_{m_{22}\times 1} \\ q_1^T \oplus P_{11}^T a_{11}^T \end{bmatrix}. \quad (20)$$

Now, decompression as described above may be performed. That is, by decoding $t_1^{(2)}$ on $C_{11}$, $\hat{c}_1^{(2)}=[\hat{a}_{11}\ 0_{1\times(k-m_{11})}$ $\hat{a}_{11}P_{11}]$ may be obtained, from which results $\hat{a}_{11}$. Given the complete coded part $[\hat{a}_{11}\ \hat{a}_{12}]$, $\hat{x}$ may easily be reconstructed as: $\hat{x}=[\hat{a}_{11}\ \hat{a}_{12}]G_1\oplus t_1$. The second source is then: $\hat{y}=\hat{x}\oplus t\oplus\hat{c}$.

Note that two decoding steps are needed here. First, decoding on the main code C is performed, and then on its subcode $C_{11}$. Whereas C should be a good code for the correlation channel among the sources, $C_{11}$ must be a good code for a channel driven by statistics of the sources. These demands may present design problems.

Multiple Arbitrarily Correlated Sources

Proposition 2 (Parts 2 and 3) may provide necessary and sufficient conditions for when a unique SW code can approach the theoretical limit (4). Proofs and some remarks are now presented.

Remark 1: For L=2 condition (6) is always satisfied. Thus, as given in Proposition 1 (Part 2), two uniformly distributed sources can always be decoded using a single code.

Remark 2: Equation (6) is satisfied if and only if $$H(X_2|X_1)=H(X_3|X_1,X_2)=\ldots=H(X_L|X_1,\ldots,X_{i-1},X_{i+1}\ldots,X_{L-1})=1. \quad (21)$$

This follows from the chain rule, the fact that conditional entropy is bounded between zero and one [28], and self entropies of all sources are one since they are uniform. Equivalently, (21) asserts that each subset of $\{X_1,\ldots,X_L\}$ (with less than L elements) is a set of statistically independent random variables.

Remark 3: If the correlation is given only by $w_H(x_1\oplus\ldots\oplus x_L)\leq t$, then the condition of Proposition 2 is satisfied. Indeed, $x_1,\ldots,x_{i-1},x_{i+1},\ldots,x_L$ can always be chosen independently (thus, (21) will hold), and then choose $x_i$ to satisfied the Hamming weight constraint.

Proof of Part 2 and Part 3 of Proposition 2: First, the converse (Part 3) is proven. Without loss of generality, suppose that each source $X_i$ is compressed with an $(n,m_i)$ linear block code $C_i$. Thus, realizations $x_i\in X_i^n$ of $X_i^n$ are put into $2^{n-m_i}$ bins each containing $2^{m_i}$ elements. Given indices of the bins to which the realizations of the sources belong, the decoder should be able to recover the only jointly typical $(x_1,\ldots,x_L)$-tuple. It can decode received sequences on $C_L$ to recover first $\hat{x}_L$, but then, clearly, the same code $C_L$ cannot be used for recovering other sources. On the other hand, using a code $C_j$ ($j\neq L$) only, the decoder cannot recover the sources. Thus, a single decoding on a code used for encoding cannot yield the reconstruction of all the sources.

Therefore, the decoder can merely try to combine the codes and construct a new algebraic binning scheme. However, in this case independent codes may not be used for encoding. (Recall that this is also the case for coding two nonuniform sources, as shown above.) Indeed, assume that the codes used for encoding are independent, that is, they can be regarded as nonoverlapping subcodes of a main (n,k) code. Suppose that the sources are compressed at rates $nR_i=n-m_i$, i=1,...,L that approach the bound (4), i.e., $$R_1+\ldots+R_L = \frac{Ln-k}{n} \geq H(X_1,\ldots,X_L). \quad (22)$$

Without loss of generality, set $X_i=X_1$. Then, since it was assumed that the subcodes do not overlap, from the chain rule [28] and (22), it follows that:

$$k=m_1+\ldots+m_L\leq n(L-H(X_L)-H(X_{L-1}|X_L)-\ldots -H(X_1|X_2,\ldots,X_L)). \quad (23)$$

It is easily shown that the capacity of the correlation channel (with the input $x_1$ and the output $x_2 \oplus x_3 \oplus \ldots \oplus x_L$) is upper bounded by $1-H(X_1|X_2, \ldots, X_L)$. Thus, $$1 - H(X_1 \mid X_2, \ldots, X_L) \geq \frac{k}{n}.$$

Since by assumption, (6) does not hold, $n(L-H(X_L)-H(X_{L-1}|X_L)- \ldots -H(X_1|X_2, \ldots, X_L))>n(1-H(X_1|X_2, \ldots, X_L))$, that is, $k<n(L-H(X_L)-H(X_{L-1}|X_L)- \ldots -H(X_1|X_2, \ldots, X_L))$. From this, $R_1+ \ldots +R_L>H(X_1, \ldots, X_L)$ obtains, and so the limit (4) cannot be approached. Thus, the subcodes must overlap. It has already shown that if the subcodes overlap, we cannot reconstruct the sources with a single decoding step. This proves Part 3. The proof of Part 2 (the direct part), that is, the code design, is similar to those presented above. Note that the same result follows from the discussion in [35].

To design a limit-approaching code for multiple (nonuniform) sources multiple decodings may be necessary. In order to use again a single main code, subcodes used for encoding of the sources may be overlapped. Such a code that potentially approaches the joint entropy limit in a general SW setup may be referred to as a general SW code. Note that if K subcodes are needed to approach any corner point on the bound, then by employing K subcodes any point on the bound may be approached. The design of a general SW code is similar to the case of decoding two nonuniform sources; to approach the limit, in each decoding step, the decoder must exploit the whole currently available joint statistics of the sources. Together all decodings may exploit the whole joint statistics of the sources.

In general, for coding L nonuniform sources L decodings (L nested subcodes) are needed; in each decoding step decoding on a subcode of the code used in the previous step is performed. Thus, an L-nested code structure is needed. Moreover, the virtual communication channels at successive steps may differ. Thus, in this code structure, nested codes should be designed for different channels. This makes code design very difficult; so finding an efficient practical code design for this general setting is still an open problem.

Practical Approach: Single Decoding

Note that the set of all unique SW codes is a subset of the set of all general SW codes. Thus, the designs described above are only special cases of general SW coding. However, many special cases were described separately, e.g., instead of providing one general code design algorithm, for two reasons. First, the description of the code design in the general SW setup may lack clarity (a clear description is needed so that the algorithms can be easily implemented); second, a primary benefit of the techniques described herein to provide practical solutions, and the elaborated code construction methods are efficient only in special cases; for the general setup, the solution's value may be substantially theoretical. Further details regarding the theoretical construction of general SW codes may be found in [35]. Since practical code designs are addressed herein, the following investigates the degree of loss resulting from exploiting a single decoding (i.e., unique SW code) in the general case, as compared to the optimal scheme that exploits multiple decodings (i.e., general SW code).

Note that the successive decodings in general SW coding may be considered as solely improving already obtained results. Indeed, each successive step exploits the remaining correlation only. By stopping in an earlier stage the sources may be recovered; however, the theoretical limit may not be approachable. An interesting question that arises then is: if the method is constrained to K decodings (K channel codes), what is the achievable rate region for compressing L i.i.d. sources? The next proposition provides the answer.

Proposition 5: The achievable rate region for compressing L i.i.d. sources $X_1, \ldots, X_L$ at rates $R_1, \ldots, R_L$, respectively, by employing a maximum of K decodings is:

$$R_{i_1} + \ldots + R_{i_p} \geq H(X_{i_1}, \ldots, X_{i_p} | X_{j_1}, \ldots, X_{j_{L-p}}), p \leq K$$

$$R_{i_1} + \ldots + R_{i_p} \geq p - K + H(X_{i_1}, \ldots, X_{i_K} | X_{j_1}, \ldots, X_{j_{L-K}}),$$
$$p > K,$$

where $\{i_1, \ldots, i_p\} \subseteq \{1, \ldots, L\}$ and $\{j_1, \ldots, j_{L-p}\} = \{1, \ldots, L\} \setminus \{i_1, \ldots, i_p\}$.

Proof: Without loss of generality, suppose that $X_{i_t} = X_t$ for $t=1, \ldots, L$ and $H(X_1|X_2, \ldots, X_L) \leq \ldots \leq H(X_{L-1}|X_L) \leq H(X_L)$. Let $G_{k \times n}$ be the generator matrix of the systematic main code C, where $k \leq n(1-H(X_1|X_2, \ldots X_L))$. Assume the corner point is approached. Then, the first encoder compresses $X_1$ using all $m_1=k$ rows of G achieving the rate $$R_1 = \frac{n - m_1}{n} \geq H(X_1 \mid X_2, \ldots, X_L).$$

The p-th encoder (p<K) uses the first $m_p \leq n(1-H(X_p|X_{p+1}, \ldots, X_L))$ rows of G and thus compresses its source message $X_p$ at rate $$R_p = \frac{n - m_p}{n} \geq H(X_p \mid X_{p+1}, \ldots, X_L).$$

Thus, for p<K, $R_1+ \ldots +R_p \geq H(X_1|X_2, \ldots, X_L)+ \ldots +H(X_p|X_{p+1}, \ldots, X_L)=H(X_1, \ldots, X_p|X_{p+1}, \ldots, X_L)$. After compressing K-1 sources in this way, the remaining $m_K \geq n(1-H(X_K|X_{K+1}, \ldots, X_L))$ rows may be split among other encoders without sharing the same rows. Thus, for p>K (this is the point when sources $X_{p+1}, \ldots, X_L$ are transmitted uncompressed), $$R_K + \ldots + R_p = \frac{(p-K)n + n - m_K}{n} \geq p - K + H(X_K \mid X_{K+1}, \ldots, X_L).$$

Since, $R_1+ \ldots +R_{K+1} \geq H(X_1|X_2, \ldots, X_L)+ \ldots +H(X_{K-1}|X_K, \ldots, X_L)$, using the chain rule [28] the desired inequality may be obtained. From the construction, it may be seen that all the rates satisfy the SW bound (4).

Note that the loss here is due to the fact that the correlation among sources $X_{K+1}^n, \ldots, X_p^n$ (for all $p \in \{K+1, \ldots, L\}$) is not exploited. The performance loss compared to (4) is $p-K-H(X_{K+1}, \ldots, X_p|X_{p+1}, \ldots, X_L)$; thus, if these sources are independent and uniform, i.e., $H(X_{K+1}, \ldots, X_p|X_{p+1}, \ldots, X_L)=p-K$, then the described technique will be optimal; by setting K=1 and p=L, the result of Proposition 2 may be obtained. Note that the first K-1 sources are compressed optimally. For example, to compress two nonuniform sources $X^n$ and $Y^n$ with a single channel code, the minimum achievable sum-rate is $n(1-H(X|Y))$, which is $n(1-H(Y))$ bits away from the SW limit.

Extension to General Lossless Multiterminal Networks

The design methods presented above may now be extended to the general MT setting [12], [13]. For practical reasons only the construction using unique SW codes (single decoding) will be discussed. Thus, in the following, uniformly distributed sources and the restrictive correlation model (6) are assumed. (Note that the method described below can also be applied in the general case, but with a certain performance loss.) By replacing unique SW codes with general SW codes, the general solution may be obtained.

Consider a general MT system which consists of L encoders and P decoders. Let $X_1, \ldots, X_L$ be discrete, i.i.d. uniformly distributed, correlated binary random variables and let $\Sigma = \{1, \ldots, L\}$. The i-th encoder compresses $X_i^n$ independently from the information available at other encoders. The j-th decoder ($1 \leq j \leq P$) receives the bitstreams from a set of encoders $$\sum_j \subseteq \sum$$

and jointly decodes them. The j-th decoder should reconstruct received source messages with arbitrarily small probability of error.

Let $Q_1, \ldots, Q_L$ be auxiliary random variables such that for any $$A, B \subseteq \sum_j,$$

a Markov chain $Q_A \to X_A \to X_B \to Q_B$ holds, where for any set $$Z = \{z_1, \ldots, z_{|z|}\} \subseteq \sum_j,$$

we used the notation $X_Z = (X_{z_1}, \ldots, X_{z_{|z|}})$ and $Q_Z = (Q_{z_1}, \ldots, Q_{z_{|z|}})$. Then, the achievable rate region is [12], [13]:

$$\sum_{i \in S} R_i \geq I\left(X_S; Q_S \Big| Q_{\bar{S}-S}^j\right) + \sum_{i \in S} \max_{k: \mu(k)=i} H\left(X_i \Big| Q_{\bar{S}}^k\right), \quad (24)$$

where $$S \subseteq \sum_j \text{ and } \mu(j) \in \sum_j,$$

and the j-th decoder is to reconstruct messages $X_{\mu(j)}^n$ perfectly.

Various embodiments of the present invention enable one to construct a practical code that can come close to the above bound. To do so, the fact that such an MT network can be split into P subnetworks may be exploited, where each subnetwork is regarded as an SW coding system with multiple sources [4]. This SW subnetwork includes a decoder which receives encodings of all $X_k^n$, s such that $$k \in \sum_{SW} \subseteq \sum$$

and attempts to perfectly reconstruct source messages. (The code designs for this subnetwork are described above.)

To provide a code for a general MT setting, a single main code C may be constructed and partitioned into subcodes, each being a unique SW code. A key idea is to allow overlapping of the subcodes that encode messages that are independently decoded (at different decoders). For each $i=1, \ldots, P$, let $(C_i, M_i)$ be a unique SW code used for coding sources $$X_{\Sigma_i}, \text{ where } \sum_i = \{i_1, \ldots, i_{S_i}\} \subseteq \sum,$$

and let $V_i$ be the corresponding coded vector. Then, consider the following definition.

Definition 2: An MT code for compressing sources $X_1, \ldots, X_L$ at rates $R_1, \ldots, R_L$, respectively, is a pair (C,S), where C is an (n,k) linear channel code with the coded vector $V = [a_1 \, a_2 \ldots a_L]$ and $S = \{(C_1, M_1), \ldots, (C_P, M_P)\}$ is a set of unique SW codes such that for each $i \in \{1, \ldots, P\}$, $C_i$ is a subcode of C, for $$i = 1, \ldots, L R_i = \frac{n - m_i}{n},$$

and for any j and l, $1 \leq j, 1 \leq P$, if $$g \in \sum_j \text{ and } g \in \sum_l,$$

then the coded vectors of $C_j$ and $C_l$ contain on the same position the same $m_g$ columns of V.

The design of an MT code for separate compression of messages $X_1, \ldots, X_L$ at rates $R_1, \ldots, R_L$, respectively, is now described. Suppose that $x_1, \ldots, x_L$, realizations of $X_1^n, \ldots, X_L^n$, respectively, are given by (10). Let the i-th SW subnetwork (i=1, \ldots, P) include the i-th decoder connected to $S_i$ encoders, where the j-th encoder encodes message $X_{i_j}^n$, $$j \in \sum_i = \{i_1, \ldots, i_{S_i}\}.$$

First, a linear channel code C given by generator matrix $G_{k \times n} = [A_{k \times k} \, P_{k \times (n-k)}]$ may be formed. Let its k-length coded vector be $V = [a_1 \, a_2 \ldots a_L]$. Then, for each $i \in \{1, \ldots, P\}$ an $(n, k_i)$ subcode $C_i$ of C may be formed, such that the k-length coded vector $V_i$ of $C_i$ contains in the same positions groups of $m_{i_1}$, $m_{i_2}, \ldots,$ and $m_{i_{S_i}}$ columns of V ($m_{i_j} = n - nR_{i_j}$ for $j=1, \ldots, S_i$) and all other zeroes; thus, $k_i = m_{i_1} + \ldots + m_{i_{S_i}}$, and $b_{i_j}$, $j=1, \ldots, S_i$, maybe formed using (14) with $V_{SW} = V_i$. If several unique SW codes compress the same message $X^n$ at rate $R_X$, then their corresponding coded vectors contain the same $m_X = n - nR_X$ columns of V. This introduces interaction among the SW codes.

For example, let $\Sigma_1 = \{2,3\}$ and $\Sigma_2 = \{1,2\}$. Then, $V_1 = [O \, a_2 \, a_3 \, O \ldots O]$ and $V_2 = [a_1 \, a_2 O \ldots O]$.

If however, two messages $X_i^n$ and $X_j^n$ are never decoded by the same decoders, then $a_j$ ($|a_j| \leq |a_i|$) may be reallocated, so that $a_i$ and $a_j$ occupy the same columns in the corresponding coded vectors, and reduce k for $|a_j|$. Thus, in the above example assuming $|a_1|=|a_3|$, $V_1=[a_3\ a_2\ O\ \ldots\ O]$ and $V_2=[a_1\ a_2\ O\ \ldots\ O]$ may be obtained. The encoding and decoding processes are essentially the same as with a unique SW code.

Proposition 6: Let (CS) be an MT code, where $S=\{(C_1, M_1), \ldots, (C_P, M_P)\}$. If for each $i=1, \ldots, P$, $(C_i, M_i)$ is constructed according to Proposition 3 assuming the same correlation among sources $X_1^n, \ldots, X_L^n$, then the decoding error with the (C,S) code equals zero.

Proof: Follows from Proposition 3.

Note that it is assumed that all sources should be perfectly reconstructed at the receiver. However, if some sources play only the role of side information (i.e., helpers), then they can be (lossy) pre-encoded [6]. Optimal coding with helpers is not addressed herein.

Though theoretically possible, constructing a single code for the entire MT network is in general impractical. Indeed, for each SW subcode $(C_i, M_i)$, where $C_i$ is an $(n,k_i)$ channel code, if $k_i<k$, then the k-length coded vector $V_i$ contains $k-k_i$ unused columns (that is, $V_i=[O\ a_{i_1}\ O\ a_{i_2}\ O\ \ldots\ a_{iS_i}\ O]$ where $$\sum_{j=1}^{S_i} |a_{i_j}| = k_i < k).$$

This weakens the channel code $C_i$, and thus makes the design very difficult. If the MT setting is such that in each SW subnetwork all columns of all coded vectors are exploited (that is, for each i, $$\sum_{j=1}^{S_i} |a_{i_j}| = k_i = k),$$

then the MT code can approach the theoretical limit in the no-helper case. Although this condition seems restrictive, it can be fulfilled in networks considered in [5], [6], [7], [8], [9], [10] (modified so that each decoder reconstructs perfectly all received source messages); however, it is not fulfilled in the "cyclic source coding" example given in [12].

The construction method described herein applies also to the discrete remote multiterminal setting [2], [11] (the CEO problem [41]) where each encoder observes only a noisy version of the source. Indeed, for an i.i.d. source W, the observation at the i-th encoder can often be modeled as $X_i=W \oplus N_i$, $i=1, \ldots, L$, where $N_i$ is an i.i.d. discrete random variable independent of W.

For clarity, an example of the design of a single MT code is now provided for the simple network considered by Wyner [6]. This design is based on a non-systematic code construction. Let $X^n$, $Y^n$, and $Z^n$ be three discrete, memoryless, uniformly distributed, random variables of length $n=7$ bits such that the Hamming distance between $X^n$ and $Y^n$ and $X^n$ and $Z^n$ is at most 1 bit and $nH(Y|X)=nH(Z|X)=3$ bits. The source messages may be encoded separately and sent to two decoders. The first decoder may operate to losslessly reconstruct $X^n$ and $Y^n$ from the received encodings of $X^n$ and $Y^n$. The second decoder may receive compressed versions of $X^n$ and $Z^n$ and attempt to reconstruct them perfectly. (Note that this version of the problem deviates slightly from the original problem of [6], in that this version requires that the decoders also reconstruct common message X perfectly.) The task is to minimize the sum of the rates of all encoders, $R=R_X+R_Y+R_Z$, under the constraint $R_X=R_Y=R_Z$. (Note that the theoretical limit for the sum-rate nR under the constraint $R_X=R_Y=R_Z$ is 15 bits. However, one can achieve $nR=13$ bits by sending messages at rates $nR_x=nH(X)=7$ bits, $nR_y=nH(Y|X)=nR_z=nH(Z|X)=3$ bits.) Since $n=7$ bits, and a code is needed that corrects one error, for an MT code C a (7,4) Hamming code is selected, defined by the generator matrix:

$$G_{k \times n} = [A_{4 \times 4} P] = \begin{bmatrix} 0111100 \\ 1001100 \\ 0101010 \\ 1101001 \end{bmatrix}.$$

Since two SW coding subnetworks are involved, two unique SW codes, $C_{SW1}$ and $C_{SW2}$, may be formed, defined by the generator matrices $G_{SW1}=G_{SW2}=G$. Note that because $Y^n$ and $Z^n$ are decoded independently, overlapping of the two SW codes is allowed.

Let realizations of the sources be $x=[0010110]$ and $y=[0110110]$. Since the Hamming distance is one, it should be possible to decode the messages correctly.

Syndromes for both x and y may be formed. To do so, x and y may be written in the form $x=[a_1\ v_1\ q_1]=[00\ 10\ 110]$, $y=[u_2\ a_2\ q_2]=[01\ 10\ 110]$.

The coded vector is $V_{SW1}=[a_1\ a_2]$. Then, (14) results in:

$b_1=[a_1 O_{1\times 2}]A^{-1}=[0000]$, $b_2=[O_{1\times 2}\ a_2]A^{-1}=[1010]$.

The syndromes, $s_1$ and $s_2$, are:

$$s_1^T = \begin{bmatrix} v_1^T \\ P^T b_1^T \oplus q_1^T \end{bmatrix} = [10\ 110]^T,$$

$$s_2^T = \begin{bmatrix} u_2^T \\ P^T b_2^T \oplus q_2^T \end{bmatrix} = [01\ 000]^T.$$

The length $n=7$ row-vectors $t_1$ and $t_2$ are then given by:

$$t_1^T = \begin{bmatrix} O_{2\times 1} \\ v_1^T \\ P^T b_1^T \oplus q_1^T \end{bmatrix} = [00\ 10\ 110]^T,$$

$$t_2^T = \begin{bmatrix} u_2^T \\ O_{2\times 1} \\ P^T b_2^T \oplus q_2^T \end{bmatrix} = [01\ 00\ 000]^T.$$

Then the row-vectors $x \oplus t_1$ and $y \oplus t_2$ are codewords of the code C.

Thus, given $s_1$ and $s_2$, the joint decoder finds the codeword in C that is closest to $t_1 \oplus t_2=[01\ 10\ 110]$. Since there is no error in decoding, this codeword will be $\hat{c}=x \oplus t_1 \oplus y \oplus t_2=[00\ 10\ 110]=[\hat{a}_1\ \hat{a}_2\ \hat{g}]$ because the Hamming distance between x and y is one and the minimal Hamming distance of the code C is three. The corresponding reconstructions $\hat{a}_1=a_1$ and $\hat{a}_2=a_2$ are then obtained from the codeword $\hat{c}$. Since $\hat{b}_2=[O_{1\times 2}\ \hat{a}_2]A^{-1}=b_2$, y may be reconstructed as $\hat{y}=\hat{b}_2 G \oplus t_2=[01\ 10\ 110]=b_2 G \oplus t_2$. Thus, y is indeed recovered error-free. Using $C_{SW2}$ with k-length coded vector $V_{SW2}=[a_1\ a_3]$ the second decoder can reconstruct $z=[u_3\ a_3\ q_3]$ in the same way.

Note that in this example, Y and Z are independently decoded and, thus, the same subcode is used for their compression.

Practical Code Design

Embodiments of a method for designing practical unique SW codes for coding uniformly distributed sources X and Y using systematic IRA and turbo codes are now described. The notation established above is used.

Systematic IRA Codes

In [19], it was shown that by using low-density parity-check (LDPC) codes it is possible to come very close to the theoretical limits in the asymmetric SW scenario. IRA codes [33] are a special class of LDPC codes which suffer very small performance loss, but can easily be coded in systematic form and have low encoding complexity which make them suitable for multiterminal coding [2]. They combine the advantages of LDPC codes (message-passing iterative decoding, simple analysis and code design) and turbo codes (linear time encoding). Their performance is comparable to that of irregular LDPC codes of the same codeword length.

Figure 6:
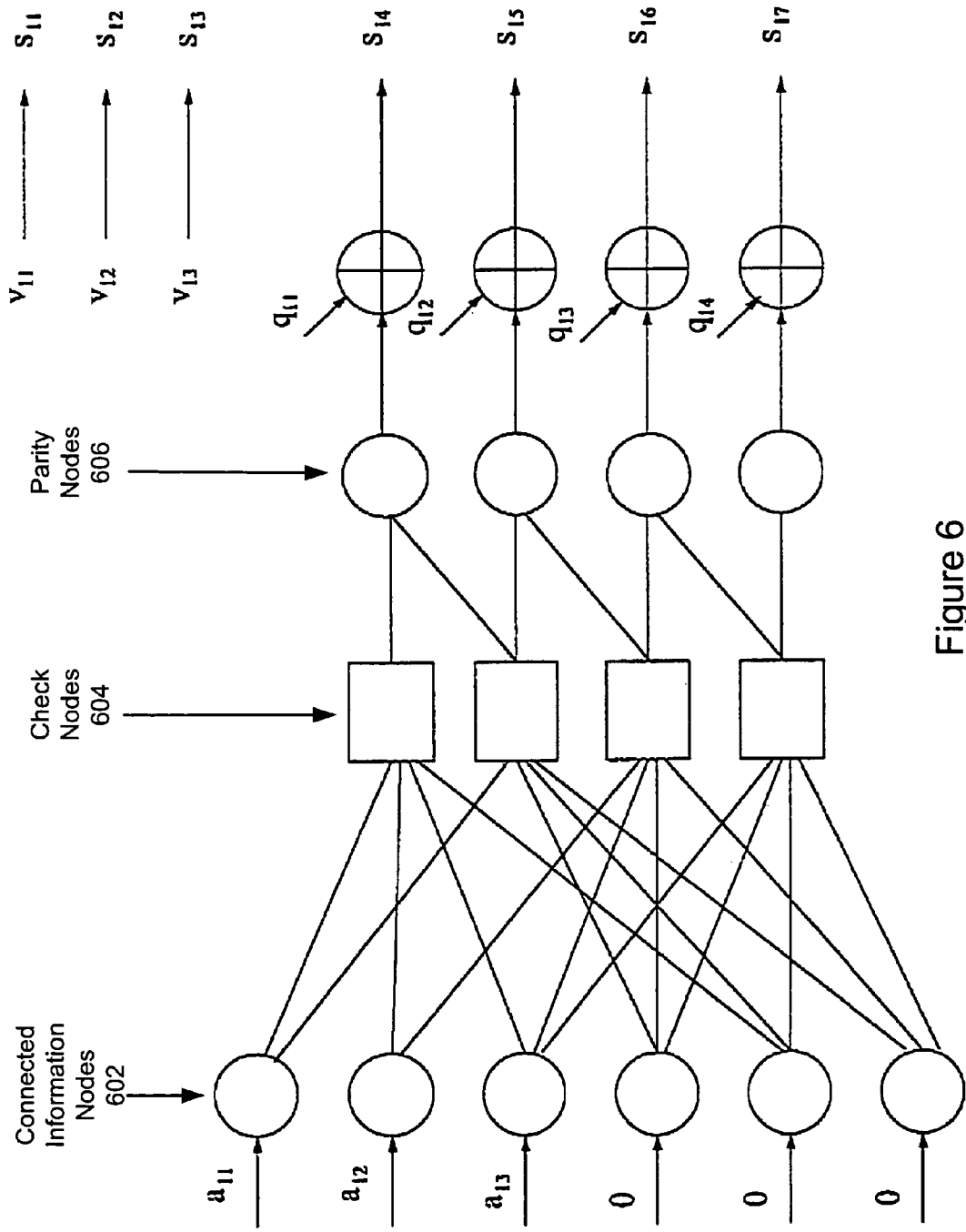
FIG. 6 illustrates Slepian-Wolf encoding, according to one embodiment.

FIG. 6—Encoding Multiple Data Sources

FIG. 6 illustrates one embodiment of encoding of a source x. As FIG. 6 shows, in this example, at each check (square) node 604 all the connected information nodes 602 (cycles on the left) are modulo-2 added and corresponding values of the parity nodes 606 (cycles on the right) are determined. Then, $q_1$ is modulo-2 added. Here n=10, k=6, m=3, $\lambda(x)=0.25x+0.75x^2$, and $\rho(x)=x^3$.

Suppose that IRA code is given by generator matrix $G_{k \times n} = [A_{k \times k} \; P]$. At the first encoder, the length n source output x is split into three parts in the form $$x = [a_1 \; v_1 \; q_1] \quad (25)$$

where $a_1$, $v_1$, and $q_1$ are row-vectors of length $m_1$, $m_2 = k - m_1$, and n−k, respectively.

Since $A = I_k$, $b_1 P$ may be determined by setting the values of the systematic IRA variable nodes to $[a_1 \; O_{1 \times m}]$, that is, half of the systematic part may be set to zero. Next, the length $n-m_1$ syndrome $s_1$ that is formed by the first encoder may be obtained by appending $v_1$ to $b_1 P \oplus q_1$. One embodiment of the encoding procedure is represented in FIG. 6.

In a similar way, the length $n-m_2$ syndrome $s_2$ may be formed at the second encoder from $y = [u_2 \; a_2 \; q_2]$, where $u_2$, $a_1$, and $q_2$ are row-vectors of length $m_1$, $m_2$, and n−k, respectively. At the joint decoder, At the joint decoder, first, vectors $t_1$ and $t_2$ may be formed using (12); then, common IRA decoding of $t_1 \oplus t_2$ may be performed, and $â_1$ and $â_2$ obtained as the systematic part of the recovered codeword; finally, $\hat{x}$ and $\hat{y}$ may be reconstructed as:

$$\hat{x} = \hat{b}_1 G \oplus t_1, \quad (26)$$

and $$\hat{y} = \hat{b}_2 G \oplus t_2, \quad (27)$$

respectively, where $\hat{b}_1 = [\hat{a}_1 \; O_{1 \times m_2}]$ and $\hat{b}_2 = [O_{1 \times m_1} \; \hat{a}_2]$.

As a result, if the systematic IRA code used can approach the capacity of a channel, then if the same channel models the statistics of $x \oplus y$, the resulting IRA coding scheme based on the above setup will also approach the SW limit for any rate allocation between the encoders. The procedure can be generalized to any asymmetric scenario with any number of sources. However, when more than two sources are used, modeling the exact correlation with a channel is more involved and hence more challenging.

Turbo Codes

To illustrate implementation of embodiments of the present techniques with convolutional codes, turbo codes [34] are considered. Turbo codes have already been successfully applied to SW and Wyner-Ziv [42] coding of two sources. Good results are obtained with both conventional [15], [21] and nonconventional turbo schemes [16], [17], [18].

Although turbo codes [34] include two convolutional coders, they can be treated as linear block codes. Thus, the code construction is the same. Indeed, for the source realization x given by (25), $b_1 P$ may be determined first by coding the k-length vector $b_1 = [a_1 \; O_{1 \times m_2}] A^{-1}$ with the first convolutional encoder. Vector $b_1$ may also be interleaved and fed into the second encoder. The syndrome may then be formed as: $s_1 = [v_1 \; b_1 P \oplus q_1]$.

The procedure is the same for y. To produce $â_1$ and $â_2$ at the decoder, iterative maximum a posteriori decoding may be applied to the vector $t_1 \oplus t_2$. Then, $\hat{x}$ and $\hat{y}$ may be obtained from (26) and (27), respectively.

Similar to the IRA coding example, as a result of the above, if the codes can approach the capacity of a channel, then if the same channel models the statistics of $X \oplus Y$, the resulting coding scheme based on the above setup will approach the theoretical limit for any rate allocation between the encoders. The procedure can be generalized to any number of uniform sources.

Experimental Results

Various simulations were performed to illustrate the effectiveness of exemplary embodiments of the techniques disclosed herein, including SW coding of two uniform sources with various rate allocations, SW coding of three uniform sources, SW coding of nonuniform sources, SW coding with compression, and SW coding with perfect side information, among others, results of which are described below.

Figure 7:
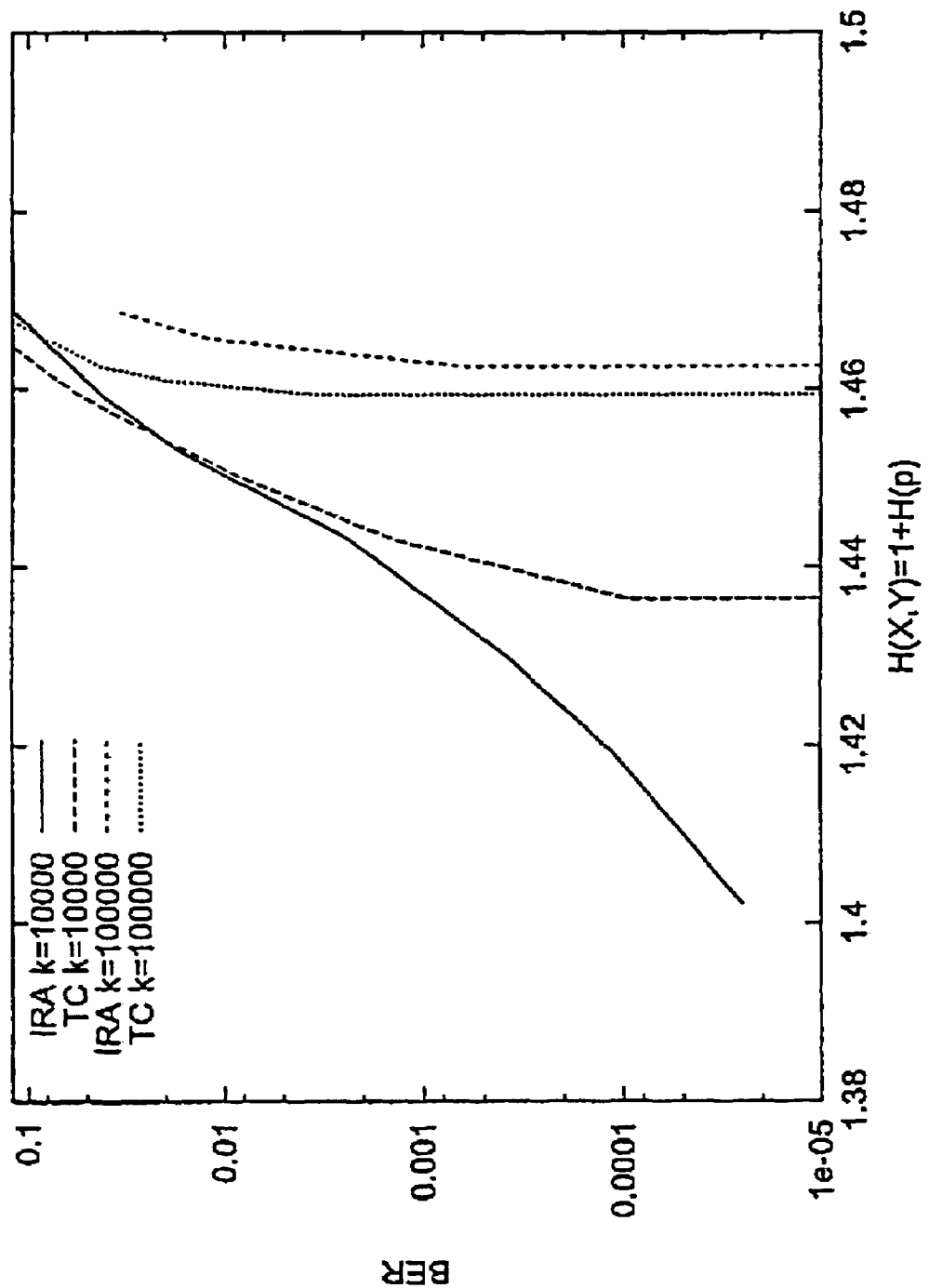
FIGS. 7-9 illustrate simulation results with IRA codes and turbo codes together with the SW bound, according to one embodiment.
Figure 8B:
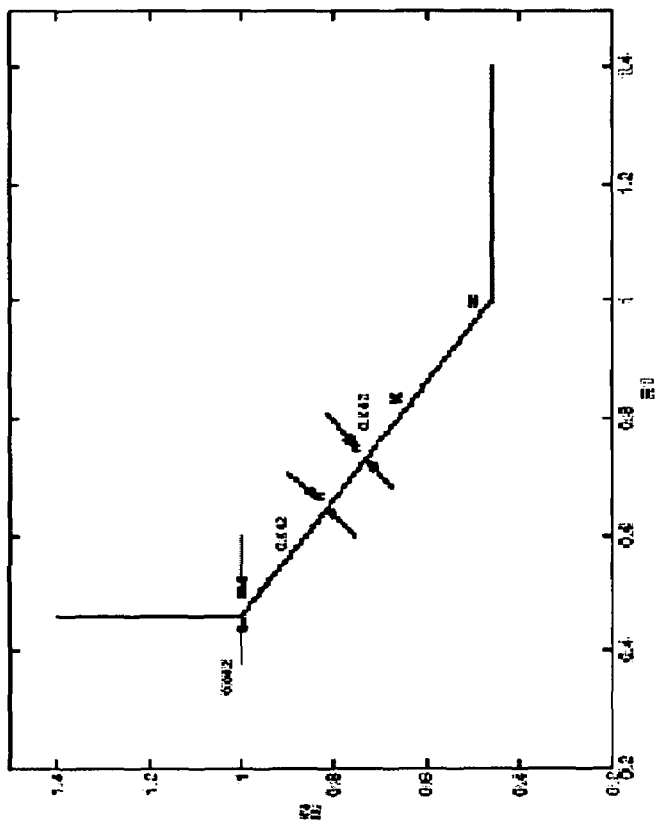

FIGS. 7-8B—SW Coding of Two Uniform Sources

A simulation of SW coding of two i.i.d. binary discrete sources X and Y whose correlation is modeled as a BSC with crossover probability p was conducted. Experimental results for IRA and turbo codes are provided below.

In these experiments, the systematic (n, k) IRA code used is with rate 0.50227 and the degree distribution polynomials [33] are: $\lambda(x) = 0.252744x^2 + 0.081476x^{11} + 0.327162x^{12} + 0.184589x^{46} + 0.154029x^{48}$, $\rho(x) = x^8$. The number of iterations in the decoder was limited to 200.

The turbo encoder preferably includes two identical recursive systematic convolutional encoders with memory length 4, generators (31, 27) octal, and code rate ⅓. The parity bits of both encoders were punctured to achieve the code rate of ½. A maximum a posteriori algorithm was used for decoding, with the number of iterations limited to 20.

Obtained results for the experiment are shown in FIG. 7. The SW bound is 1.5 bits. The information block length was k=104 and k=105 bits. For each point at least $10^8$ codeword bits were simulated. The results are given as residual bit error rate (BER) averaged over the two sources as a function of the joint entropy $H(X, Y) = H(X) + H(A|Y) = 1 + H(p)$.

More specifically, FIG. 7 illustrates bit error rate (BER) averaged over the two sources as a function of the joint entropy $H(X, Y) = 1 + H(p)$ for two different information block lengths k and two different channel coders. It can be seen that similar performances were obtained with both coders. With the length of k=10 the gap to the SW limit was about 0.04 bits, which is comparable to the results of the asymmetric approach with LDPC reported in [19]. Note that according to the present coding procedure, usually either both sources are recovered error-free or both are corrupted. Also, because of the additional encodings at the decoder side, the errors propagate. Thus, either the whole messages are perfectly reconstructed or they are heavily damaged. (This is the reason why the drop for k=10 with IRA codes was not sharp as expected.) Therefore, the decoder can detect errors with high certainty by comparing the two reconstructions.

Figure 8A:
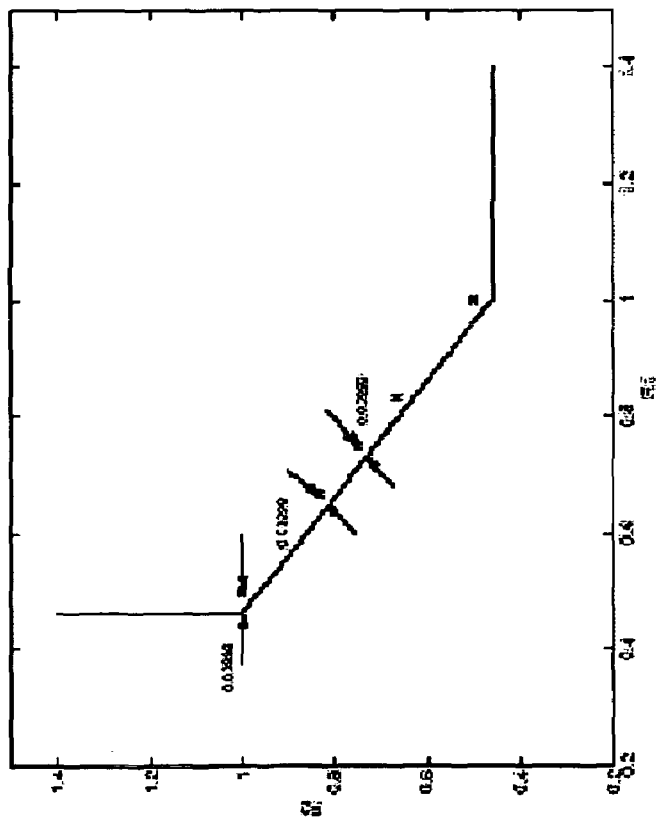

Next, three different rate allocations among the encoders were simulated by changing the number of rows ($m_1$ and $m_2$) in the generator matrices of subcodes assigned to two encoders. In addition to the symmetric scenario, where $m_1=m_2=k/2$, with obtained equal rates of both encoders, $R_1=R_2=(n-k/2)/n$, two asymmetric cases were also treated. In the first case, $m_1=k/3$ and $m_2=2k/3$, resulting in $R_1=(n-k/3)/n$ and $R_2=(n-2k/3)/n$. Finally, in the totally asymmetric scenario, $m_1$ was set to zero, and $m_2$ to k, which resulted in $R_1=H(X)=1$ and $R_2=H(Y|X)=(n-k)/n$ (a corner point). Results obtained with the IRA based scheme and k=105 together with the SW bound are shown in FIG. 8A, while FIG. 8B illustrates results using turbo codes. Error-free transmission was assumed if BER was lower than $10^{-6}$. As expected, all three cases resulted in the same gap of 0.039 bits to the bound. Thus, the different rate allocations did not affect the performance. Similar results were obtained with the punctured turbo coder.

Figure 9:
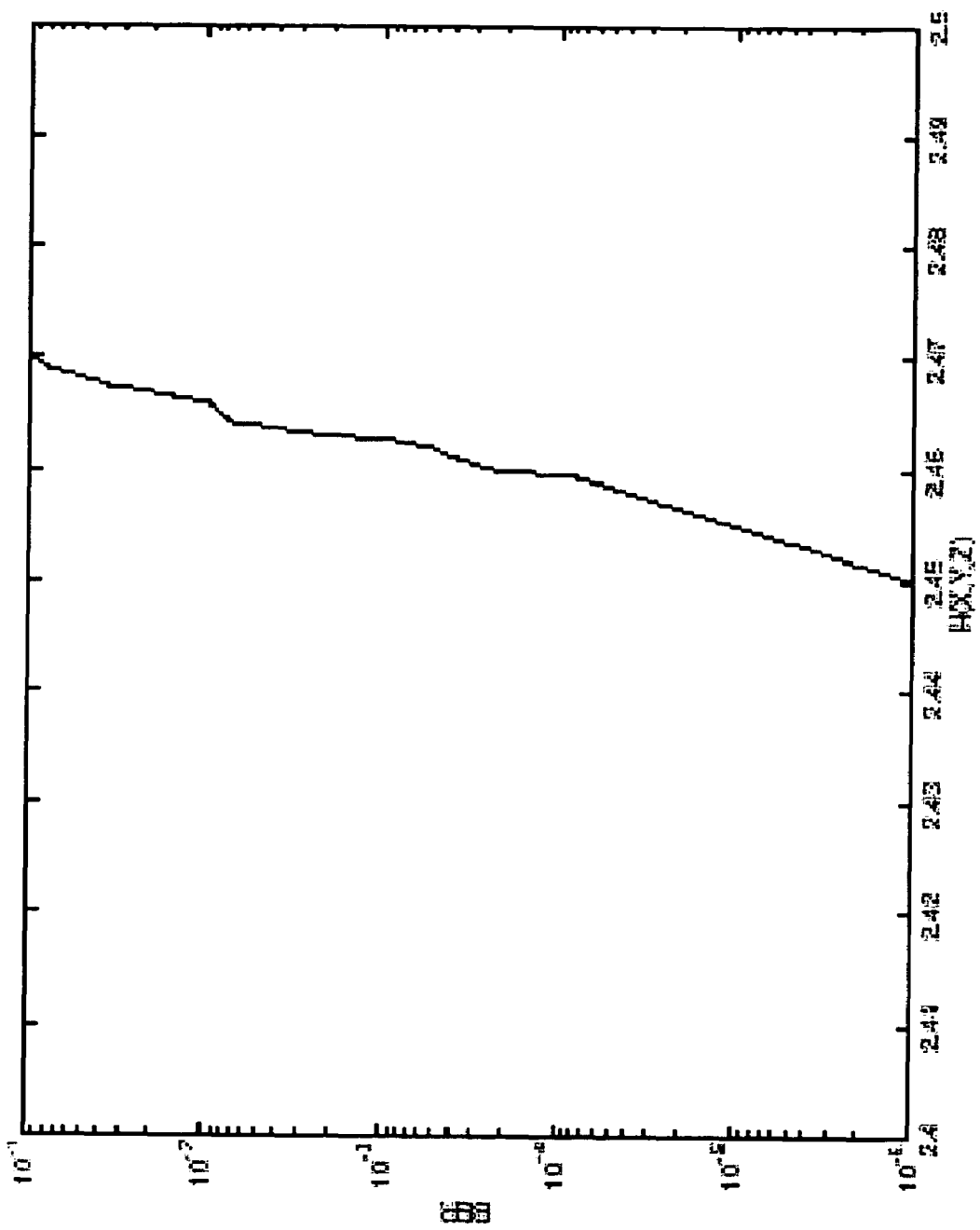

FIG. 9—SW Coding of Three Uniform Sources

FIG. 9 presents results for three i.i.d. uniformly distributed sources X, Y, and Z obtained with IRA codes and k=$10^5$. More specifically, the BER was averaged over the three sources as a function of the joint entropy $H(X,Y,Z)=2+H(p)$, obtained with IRA codes and information block length k=$10^5$. The correlation model may be completely described by the fact that $w_H(X''\oplus Y''\oplus Z'')$ is a Bernoulli-p process. The SW bound is 2.5 bits. Note that, as with two uniformly distributed sources, the same performance loss of roughly 0.04 bit was obtained. The same performance loss was indeed expected, since the decoder sees the same virtual communication channel, and decoding is performed on the same main code.

SW Coding with Compression

By using the code design described above an i.i.d. nonuniformly distributed source X was compressed, with a performance loss of 0.0471 bit. That is, by compressing source with self entropy H(X)=0.4529 using IRA code of code rate 0.5 and k=$10^5$, a residual BER below $10^{-5}$ was achieved. With a turbo code of code rate 1/3 and k=$10^4$, a residual decoding BER below $10^{-5}$ was achieved by compressing the source with self entropy H(X)=0.6148; thus, the performance loss in this case was 0.0518 bit.

Table 1—SW Coding with Perfect Side Information

TABLE 1

Gap to the bound (in bits) as a function of source entropy H(X).

| Source Entropy H(X) | 0.469 | 0.722 | 0.881 | 0.971 | 1 |
|---|---|---|---|---|---|
| Gap (IRA) | 0.121 | 0.111 | 0.074 | 0.051 | 0.039 |
| Gap (turbo code) | 0.295 | 0.171 | 0.097 | 0.072 | 0.057 |

Table Error! Reference source not found. presents results for SW coding of i.i.d. arbitrarily distributed source X when side information Y is known at the decoder. The results indicate a gap to the bound (i.e., in bits as a function of source entropy H(X)). Values of H(X) correspond to probabilities of 0.9, 0.8, 0.7, 0.6, and 0.5 in source realizations. IRA code with k=$10^5$ and code rate ½ and turbo codes with k=$10^4$ and code rate ⅓ were used. Error-free transmission was assumed if BER was lower than $10^{-5}$. Note that the performance loss is increased by decreasing source entropy. To further decrease the gap to the bound, channel codes designed for nonuniform sources may be needed. Note also that in these simulations the same systematic codes were used; however, it is expected that the performance loss may be reduced by exploiting nonsystematic codes. Note that results obtained with IRA codes are better than those reported in [20], where after SW coding, syndrome bits are entropy coded. One reason for the improvement is the use of stronger channel coding (longer channel codeword length).

SW Coding of Two Nonuniform Sources

Next, SW compression of two nonuniform sources X and Y using a single decoding was considered. In this experiment, correlation among the sources was modeled by a BSC. Entropy of X was H(X)=0.881, i.e., the probability of zero was 0.7. Using IRA codes with k=$10^5$, the gap to the SW bound (H(X,Y)) was 0.163 bit. However, the gap to the achievable limit (1+H(X|Y)) with a single decoding given by Proposition 5 was 0.086 bit. For a more biased source with entropy 0.721928 (corresponding to the probability of zero equal to 0.8), the gap to the SW bound was as high as 0.29 bit, whereas the loss to the achievable limit of Proposition 5 was 0.12 bit. Again, to decrease the gap to the bounds a channel code that performs well for nonuniform source distributions may be needed.

Using two decodings, theoretically, one can approach the SW limit; however, two nested channel codes good for different virtual communication channels may be needed; in this case, the rate loss obtained with IRA codes was always either significantly high or reducing probability of decoding error below $10^{-5}$ was not achieved.

Lossless MT Source Coding

Finally, the simple network example [6] described above was simulated. It was assumed that the correlation among X and Y and X and Z is modeled as a BSC with crossover probability p. With IRA codes and k=$10^5$ and the rate allocation among sources $R_X=R_Y=R_Z$, both decoders, the one reconstructing Y and the other reconstructing Z, suffered the same performance loss of roughly 0.043 bit compared to the theoretical limit. When X was sent uncompressed and Y and Z were transmitted at the lowest possible rates, the same performance loss for both sources was obtained; this was expected since the same code was employed.

Conclusions

Following the outlined theoretical method of Pradhan and Ramchandran [27] [Appendix G] for constructing a single channel code that achieves arbitrary rate allocation among two i.i.d. uniformly distributed sources in the SW coding problem, under the general SW setup (i.e., coding of multiple sources with the general correlation and arbitrary distributions), use of a single decoding for reconstructing all the sources was described. It was found that whenever the whole correlation among the sources is completely described by their modulo-2 sum, a single channel code can be designed to approach the joint entropy limit. Indeed, in this case, if the designed code approaches the capacity of the channel "determined" by the sum of the sources, then the same code will approach the theoretical limit in the corresponding SW compression problem. Thus, even when the number of sources is large, since all the sources are decoded on a single code, only one (good) code is needed.

Detailed descriptions of design approaches for several important special cases when a single decoding suffices have been provided, enabling determination of low-complexity code designs using advanced systematic IRA and turbo codes that are capable of approaching any point on the theoretical bound. It is noted that the designs described herein outperform all previously published approaches and come within 0.04 bit of the theoretical limit. Moreover, for coding uniform sources the same performance loss was obtained regardless of the rate allocation among the encoders and the number of sources.

Additionally, a code construction method with multiple decodings which can approach the theoretical limits in the most general SW setup, i.e., for coding i.i.d. nonuniform sources and multiple arbitrarily correlated uniform sources, was outlined, and practical design problems discussed. Since it is not yet known how to provide limit-approaching practical code designs based on multiple decodings, a single channel decoding technique in the general SW setup was described, and the inherent performance loss theoretically quantified.

The method was extended, and the first practical code designs for general lossless multiterminal (MT) networks [12], [13] with arbitrary numbers of encoders and decoders were provided. The effectiveness of the design was demonstrated using the example simple network of Wyner [6]. It is noted that to approach the theoretical limits in multiterminal coding with a fidelity criterion [2], after quantization of the sources, lossless coding may be needed to further decrease the rate [14]. Hence, in some embodiments, the methods proposed herein may be applied in this second compression step. Therefore, the design of a single practical code for an entire multi-source system, e.g., a whole sensor network [24], that can approach or even reach the theoretical limits is feasible.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A system, comprising:
   a receiver configured to couple to a plurality of correlated data sources, wherein the receiver is configured to store a generator matrix, wherein the plurality of correlated data sources are configured to store respective parity matrices that correspond to respective sub-matrices of the generator matrix, wherein each of the plurality of correlated data sources is configured to:
   encode respective data using the respective parity matrix; and
   transmit the encoded data to the receiver;
   wherein the receiver is configured to:
   receive the encoded data from each of the plurality of correlated data sources; and
   decode the encoded data received from the plurality of correlated data sources using the generator matrix and a single channel decoding to generate decoded data that corresponds to the data encoded at each of the plurality of correlated data sources.

2. The system of claim 1, wherein each of the plurality of correlated data sources is further configured to:
   determine the respective parity matrix based on the respective sub-matrix of the generator matrix.

3. The system of claim 2, wherein each of the plurality of correlated data sources is further configured to:
   partition the generator matrix to determine the respective sub-matrix based on information specifying the generator matrix and a rate allocation corresponding to a specific point in the Slepian-Wolf admissible rate region of the correlated data sources, wherein the point specifies a respective rate value for each of the plurality of correlated data sources.

4. The system of claim 3, wherein each sub-matrix comprises a respective number of rows of the generator matrix, and wherein the respective number of rows corresponds to the rate value for the corresponding correlated data source.

5. The system of claim 1, wherein the encoded data from the correlated data sources are syndromes, and wherein, in decoding the encoded data received from the plurality of correlated data sources, the receiver is configured to:
   normalize the syndromes to a common length, thereby generating respective expanded syndromes;
   compute a vector sum of the expanded syndromes;
   apply the single channel decoding to determine a closest codeword for the vector sum from a plurality of codewords, wherein the closest codeword comprises a systematic part that includes a plurality of portions corresponding respectively to the plurality of sub-matrices of the generator matrix;
   multiply each of the plurality of portions of the systematic part of the closest codeword by a corresponding sub-matrix of the generator matrix to determine corresponding intermediate vectors; and
   add each of the intermediate vectors to a corresponding one of the expanded syndromes to obtain said decoded data.

6. The system of claim 5, wherein, in applying the single channel decoding, the receiver is operable to apply either or both of:
   block coding; and
   convolutional coding.

7. The system of claim 5, wherein, in applying the single channel decoding, the receiver is operable to apply one or more of the following techniques:
   turbo decoding;
   low-density parity check (LDPC) decoding; and
   irregular repeat-accumulate (IRA) decoding.

8. The system of claim 1, wherein each of the correlated data sources corresponds to a respective smart sensor in a distributed sensor network.

9. The system of claim 1, wherein each of the correlated data sources corresponds to a respective video source in a distributed video network.

10. The system of claim 1, wherein each of the correlated data sources is associated with a central database.

11. The system of claim 1, wherein the number of rows in each of the sub-matrices of the generator matrix is determined by a point in the Slepian-Wolf admissible rate region for the plurality of correlated data sources.

* * * * *

UNITED STATES PATENT AND TRADEMARK OFFICE
CERTIFICATE OF CORRECTION

PATENT NO. : 7,653,867 B2 Page 1 of 1
APPLICATION NO. : 11/086974
DATED : January 26, 2010
INVENTOR(S) : Stankovic et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1037 days.

Signed and Sealed this

Twenty-third Day of November, 2010

David J. Kappos
*Director of the United States Patent and Trademark Office*